United States Patent
Yamaguchi et al.

(10) Patent No.: US 7,777,433 B2
(45) Date of Patent: Aug. 17, 2010

(54) POWER CONVERTER

(75) Inventors: Koji Yamaguchi, Hitachinaka (JP); Yuuji Maeda, Hitachiota (JP); Tokihito Suwa, Hitachinaka (JP); Satoru Sigeta, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1244 days.

(21) Appl. No.: 11/254,788

(22) Filed: Oct. 21, 2005

(65) Prior Publication Data

US 2006/0086981 A1   Apr. 27, 2006

(30) Foreign Application Priority Data

Oct. 22, 2004   (JP) ............... 2004-307566

(51) Int. Cl.
*H02P 3/00* (2006.01)
*H02P 5/00* (2006.01)

(52) U.S. Cl. ............ 318/139; 363/74; 363/98; 363/15

(58) Field of Classification Search ........ 318/139; 363/74, 98, 15
See application file for complete search history.

(56) References Cited

U.S. PATENT DOCUMENTS 5,418,707 A * 5/1995 Shimer et al. ............ 363/65

2002/0195286 A1   12/2002 Shirakawa et al.

FOREIGN PATENT DOCUMENTS

JP   2000-311983 A   7/2000
JP   2002-369496 A   12/2002

* cited by examiner

*Primary Examiner*—Bentsu Ro
*Assistant Examiner*—Erick Glass
(74) *Attorney, Agent, or Firm*—Crowell & Moring LLP

(57) ABSTRACT

The power converter for solving the above-described problem has a module section and a drive section for operating the module section. The drive section has a drive circuit. The drive circuit is provided so as to correspond to the first semiconductor element which is one of the semiconductor elements comprising the parallel circuit; wherein drive signals for operating the first semiconductor element are output. The drive signals that are output from the drive circuit are electrically branched and output to a second semiconductor element which is a separate semiconductor element from the first semiconductor element of the semiconductor elements comprising the parallel circuit. As a result, the second semiconductor element receives the branched drive signals and operates in the same manner as the first semiconductor element.

Thereby, a motor converter favorable for control large current at a low cost is provided.

13 Claims, 12 Drawing Sheets

POWER CONVERTER

CLAIM OF PRIORITY

The present application claims priority from Japanese application serial no. 2004-307566, filed on Oct. 22, 2004, the content of which is hereby incorporated by reference into this application.

FIELD OF THE INVENTION

This invention relates to a power converter for converting supplied power to a prescribed power.

BACKGROUND OF THE INVENTION

Known power converters include inverter units described in Japanese Patent Laid-Open No. 2002-369496 and Japanese Patent Laid-Open No. 2000-311983. Japanese Patent Laid-Open No. 2002-369496 describes connecting in parallel power modules with drive circuits. Japanese Patent Laid-Open No. 2000-311983 describes forming a power semiconductor element module by connecting a plurality of power semiconductor elements in parallel.

SUMMARY OF THE INVENTION

As described in said Japanese Patent Documents, in order to control large currents in power conversions devices, power modules or power semiconductor elements are connected in parallel and the current must be divided. However, as in the method of Patent Document 1 in which power modules including drive circuits are connected in parallel, the number of parts and the cost of the device increases in accordance with the number of parallel sets. Meanwhile, in the method of Patent Document 2 in which power semiconductor elements are connected in parallel, each time the number of power semiconductor elements is changed, new design must be developed for the power module and new production facilities must be introduced.

This invention provides a suitable, low cost power conversion device for controlling large currents.

The basic feature of this invention is that the drive circuit is provided so as to correspond to the first circuit which is one of a plurality of circuits comprising the parallel circuits for the power conversion.

The drive circuit outputs drive signals from the semiconductor elements comprising the first circuit. The semiconductor elements comprising the first circuit operate by receiving drive signals output from the drive circuit. The drive signals that are output from the drive circuit are electrically shared and supplied in the semiconductor elements of the second circuit which is the remaining circuit comprising the parallel circuit. The semiconductor elements comprising the second circuit receive the branched drive signals and operate in the same manner as the semiconductor elements comprising the first circuit.

According to this invention, in order to control a large current, even when the modules section comprises a plurality of semiconductor modules, the number of drive circuits is never increased in accordance with the number of parallel sets of the plurality of semiconductor modules.

According to this invention, because the number of drive circuits is never increased in accordance with the number of parallel sets in the plurality of semiconductor modules, a favorable power converter for controlling large currents can be provided at a low cost.

DESCRIPTION OF THE PREFERRED EMBODIMENTS

Figure 1:
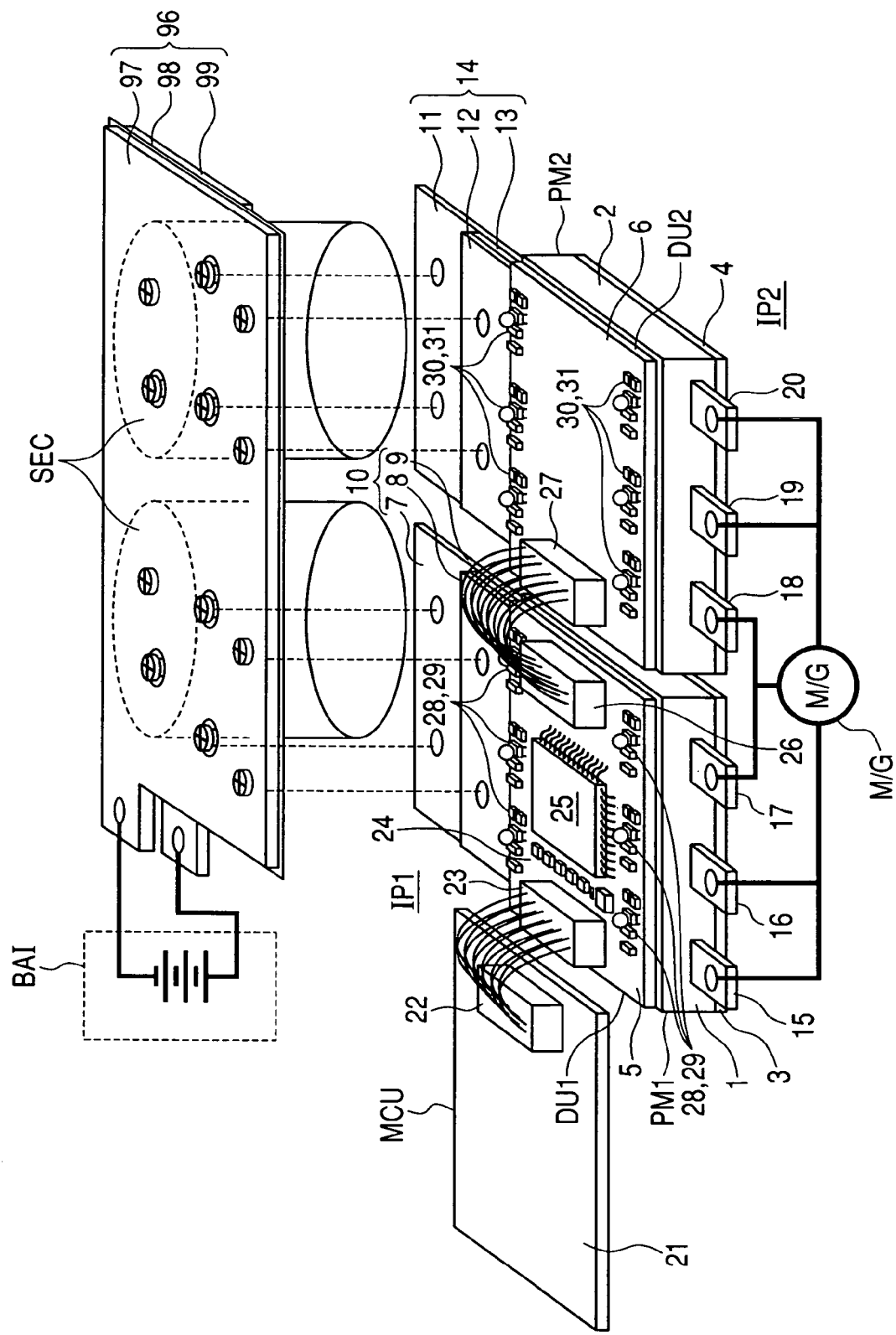
FIG. 1 is a perspective view showing the external structure of the vehicle inverter unit of the first embodiment of this invention.

The most typical preferable embodiment of the power converter of this invention is as described in the following. Namely, in the power converter in which the power output from the power supply source is converted to a prescribed power, and the converted power is output to a power supply destination, the power converter comprises a module section and a drive section for operating the module section, and the module section comprises a plurality of semiconductor modules, and the plurality of semiconductor modules comprise semiconductor elements for power conversion and the semiconductor elements form parallel circuits in which corresponding semiconductor elements are electrically connected in parallel to each other, and the parallel circuit is electrically connected between a power supply source and a power supply destination and the drive section comprises a drive circuit and the drive circuit is provided so as to correspond to the first semiconductor element which is one of the semiconductor elements comprising the parallel circuit; wherein drive signals for operating the first semiconductor element are output and the first semiconductor elements operate by receiving drive signals output from the drive circuit and the drive signals that are output from the drive circuit are electrically branched and output to a second semiconductor element which is a separate semiconductor element from the first semiconductor element of the semiconductor elements comprising the parallel circuit, and the second semiconductor element receives the branched drive signals and operates in the same manner as the first semiconductor element.

Embodiment 1

The first embodiment of this invention will be described based on FIG. 1 to FIG. 8. FIG. 1 to FIG. 7 shows the configuration of a vehicle inverter unit of this invention. FIG. 8 shows a vehicle in which the vehicle inverter unit of any of FIG. 1 to FIG. 7 is loaded.

A vehicle inverter unit controls the driving of a vehicle engine and converts direct current supplied from the vehicle battery which forms the vehicle power source to alternate current and the obtained alternate current is supplied to the vehicle engine.

It is to be noted that the configuration described below may be suitably applied to vehicle direct current-direct current power converters such as DC/DC converters or direct current choppers and the like. In addition, the configuration described below is not limited to a vehicle converter device and may be used for any power converter for which large current control is necessary such as an industrial or home power converter device.

First the configuration of the vehicle of this embodiment will be described based on FIG. 8.

The automobile shown in FIG. 8 is a hybrid electric automobile which is one type of motor vehicle. The hybrid electric automobile has two power systems. One is an engine system in which an engine ENG which is an internal device is the power source and this is mainly used as the drive source for the automobile. The other one is a power system with a motor generator M/G as the power source and this is mainly used as the starting source for the engine ENG and the assist source for the engine ENG and the power generation source for the automobile.

In the hybrid automobile of this embodiment idle, operation is possible. Idle step operation refers to the operation mode in which the operation of the engine ENG is temporarily stopped with the ignition key in the ON state for example when the automobile is stopped for example to wait for a traffic signal, and when the automobile moves, operation of the engine ENG is resumed.

A front drive shaft (FDS) is axially supported so as to rotate at the front portion of the vehicle body (not shown). The two ends of the front drive shaft (FDS) have a front right wheel (FRW) and a front left wheel (FLW). A rear drive shaft (not shown) is axially supported so as to rotate at the rear portion of the vehicle body. Both ends of the rear drive shaft have a rear wheel (not shown).

In the hybrid automobile of this embodiment, a front wheel drive system is employed. A deferential gear DEF is provided at the middle portion of the front drive shaft FDS. The output side of the deferential gear DEF is mechanically connected to the front drive shaft FDS. The output side of the transmission T/M is mechanically connected to the input side of the deferential gear DEF. The deferential gear DEF is a power transfer mechanism, and the rotational drive force that is transmitted from the transmission T/M is transferred to the left and right front drive shaft (FDS). The T/M is a power transmission mechanism and the rotational drive is changed and transmitted to the deferential gear FDS. Rotational drive from the engine ENG and the motor generator M/G is converted and transmitted to the transmission T/M.

The engine ENG has a plurality of component devices such as an injector, a slot valve, an ignition device, an intake and exhaust valve (none of which are shown in the drawing). The injector is a fuel injector valve for controlling the amount of fuel supplied for injection into the cylinder of the engine. The slot valve is a choke valve for controlling the amount of air supplied to the inside of the cylinder of the engine ENG. The ignition device is an ignition source for supplying fire for burning the mixed gases inside the engine ENG. The intake and exhaust valves are an open and close valve that is provided at the intake side and the exhaust side and the timing for opening and closing respectively is controlled so as to correspond with the cycle of the engine ENG.

The operation of the engine ENG is controlled by the engine control unit ECU. The engine control unit ECU calculates the control value for operating the each component device based on the input and output signal from the sensor or other control units or the like. The control value is output as the control signal to the driving unit for various component devices. The operation of the component devices of the engine ENG is thereby controlled.

The operation of the transmission T/M is controlled by the transmission control unit TCU. The transmission control unit TCU calculates the control value for operating the transmission based on the input signal from the sensor or other control units or the like. The control value is output as the control signal to the driving unit of the transmission mechanism. The operation of the transmission mechanism of the transmission T/M of the engine ENG is thereby controlled.

The engine ENG and the motor generator M/G are mechanically connected. The motor generator M/G transmits the rotational drive force to the engine ENG using this mechanical connection. The engine ENG also transmits the rotational drive force to the motor generator M/G. In the hybrid automobile of this embodiment, the pulley MPU that is provided at the rotational shaft of the motor generator M/G and the pulley MPU that is provided at the crank shaft of the engine ENG are mechanically connected by a belt BEL. As a result, the engine ECU and the motor generator M/G are mechanically connected.

Figure 3:
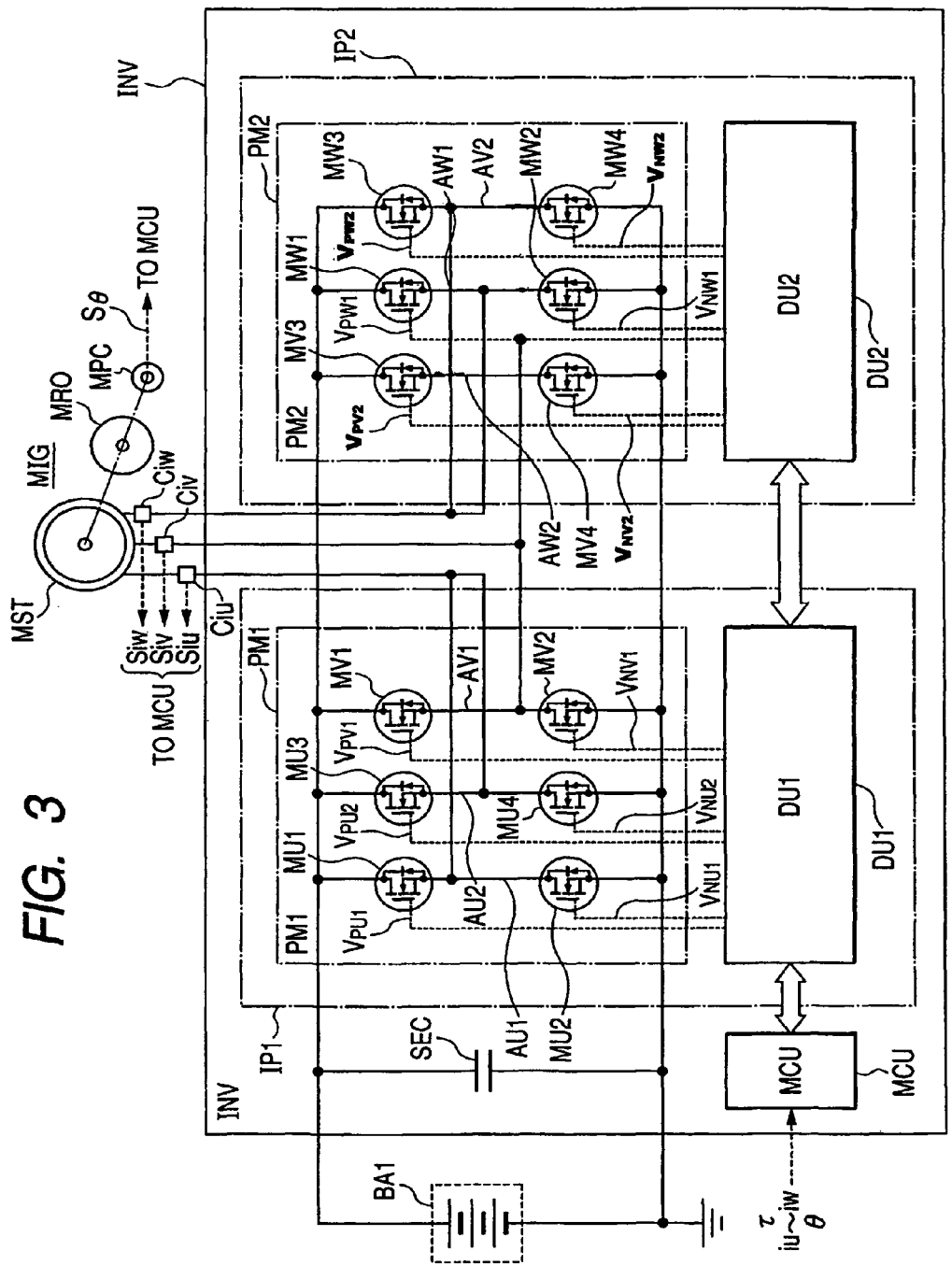
FIG. 3 is an electrical circuit map showing the circuit configuration of the on-vehicle inverter unit of FIG. 1.

The motor generator M/G is a permanent magnet type AC synchronous motor, and as shown in FIG. 3, it comprises a stator MST and a rotor MRO. The stator MST has a stator core and a stator winding. The stator core has a cylindrical shape and comprises a layered core formed by superposing a plurality of circular silicon steel plates (magnetic material) in the axial direction. A stator winding is stored inside the slot of the stator core. The method for winding the stator winding that is employed may be any one of the distribution winding (the method in which two sides of the winding span a number of slots and are stored in two slots) and concentrated winding (the method in which the winding is wound onto daises formed between adjacent slots and the two windings are stored in the adjacent slots).

The inner periphery side of the stator MST has a rotor MRO that is held such that it can rotate. The stator MST and the rotor MRO oppose each other via an opening such that the center shafts thereof are concentric. The rotor MRO has a rotor core and a permanent magnet. The stator core has a cylindrical shape and comprises a layered core formed by superposing a plurality of circular silicon steel plates (magnetic material) in the axial direction. The rotating shaft is provided in the center portion of the rotor core so as to pass through the axial direction. A plurality of magnet insertion holes that penetrate the axial direction are formed at an equal distance from each other in the rotation direction at the outer peripheral portion of the rotor core. The magnet insertion hole has a rectangular cross-section and is formed such that the long direction of the cross-section is the rotation direction and the short direction of the cross-section is the radial direction. The permanent magnet is a rectangular magnet having rotational magnetic poles which are N pole and S pole, are buried in the magnetic insertion holes such that the entire periphery is covered by the rotor core.

The N pole permanent magnet and the S pole permanent magnet are alternately disposed in the rotation direction. Auxiliary magnets are formed between adjacent permanent magnets (between the permanent magnet insertion holes). The auxiliary magnet is the core portion that formed between the magnet insertion hole and comprises a magnetic path for the flow of the magnetic flux for generating reactance torque. The length of the magnet insertion hole in the rotational direction is greater than the length in the rotational direction of the permanent magnet. Thus both ends of the permanent magnets in the rotational direction have an opening that is formed in the case where the permanent magnet is buried in the magnet insertion hole. The opening formed at both ends of the permanent magnet in the rotational direction is a magnetic hole that evens out the changes in the permanent magnet magnetic flux level distribution between the permanent magnet and the auxiliary magnet.

The driving of the motor generator M/G is controlled by the inverter unit INV. Three-phase AC power that is controlled by the inverter unit INV is supplied to the stator winding of the stator MST. As a result, the stator MST can generate a rotating magnetic field.

The three-phase AC power that is supplied to the stator winding is controlled by the inverter unit INV such that the synthesized vector of the magnetomotive force stator MST created by the current supplied to the stator winding is closer toward the rotation direction than the magnetic pole center position of the auxiliary magnet of the rotor MRO. When a rotation magnetic field is generated at the stator MST, torque due to the magnetic flux of the permanent magnets and reluctance torque due to the magnetic flux that passes through the auxiliary magnet are generated at the rotor MRO. As a result, rotational drive force corresponding to the three-phase AC power is generated at the rotor MRO. That is to say, the motor generator M/G can operate as an electric motor.

The motor generator M/G receives the rotational drive force from the engine ENG and operates as a generator. In this case, the rotor MRO receives the rotational drive force from the engine ENG and rotates. When the rotor MRO rotates, magnetic flux of the permanent magnet is interlinked with the rotor winding and magnetomotive force is generated at the stator winding. As a result, three-phase AC power corresponding to the number of rotations of the rotor MRO is generated at the stator MST. In other words, the motor generator M/G can operate as a generator. The three-phase AC power generated at the motor generator M/G is supplied to the inverter unit INV. The inverter unit INV converts the three-phase AC power to DC power. The DC power that is converted by the inverter unit INV is supplied to and charges the high voltage battery BA1.

It is to be noted that an AC synchronous machine including a Rundel type rotor or an AC inductance machine including a basket type rotor may be used as the motor generator M/G.

The Rundel type rotor has magnetic cores which are claw shaped magnetic poles, N pole and S pole, alternately disposed in the rotation direction. A field magnet winding is wound around the magnetic core. The field magnet is excitation winding for magnetizing the claw-shaped magnet pole. The field magnet winding is electrically connected to the current collector ring. The current collector ring is a conductive member that receives the current supply from the outside, and is provided on the outer periphery surface at one end side of the rotating direction of the rotating axis of the magnetic core. A brush is press-contacted to the outer peripheral surface of the current collector ring. As a result, the collector ring is electrically connected to the brush while slide contact with the contact surface of the brush, and can receive the field magnet current supply from the brush. The field magnet current supplied to the brush is controlled by a voltage regulator. The voltage regulator controls the field magnet current using the switching operation of a switching semiconductor element such as a transistor or the like, and receives control signals from the electric motor control unit of the inverter unit and generates drive signals, and the switching operation (ON/OFF) of the switching semiconductor element is controlled based in the generated drive signal.

The basket type rotor has a rotor core that is formed from a stratified core. A plurality of slots is provided at the outer periphery of the rotor core. The plurality of slots is formed by cutting out the outer periphery of the rotor core in the axial direction. A secondary conductor is pressure molded at the plurality of slots. The secondary conductors are rod-shaped conductors made of aluminum, and are buried in a plurality of slots so as to protrude in both axial directions from the both axial direction ends of the rotor core. Both axial direction ends of the plurality of secondary conductors are mechanically connected by a shunt ring which is a conductive member made of steel. As a result, the plurality of secondary conductors is electrically shunted.

The inverter unit INV is a power converter unit which converts the DC power supplied from the high voltage battery BA1 to three-phase AC power and comprises the motor control unit MCU, the drive circuit units DU1 and DU2 and the power modules PM1 and PM2. The motor control unit MCU comprises a control section which is the inverter unit INV and calculates the control value for the switching operation (ON/OFF) of the plurality of conductor elements based on the plurality of signals input, and the control value is output as the control signals to the drive circuit unit DU1. The drive circuit units DU1 and DU2 comprise the drive section of the inverter unit INV. The drive circuit unit DU1 generates drive signals for operating the switching of the plurality of power semiconductor elements according to the control signals output from the motor control unit MCU, and the drive signals are output to the power module PM1 and the drive circuit unit DU2. The drive circuit unit DU2 receives drive signals from the drive circuit unit DU1 and outputs these drive signals to the power module PM1. The power modules PM1 and PM2 comprise a main circuit for power conversion of the inverter unit INV and a plurality of power semiconductor elements.

In this embodiment, in the inverter unit INV, the power module PM1 and the drive circuit unit DU1 come together to form the intelligent power module IP1, while the power module PM2 and the drive circuit unit DU2 come together to form the intelligent power module IP2.

The power source of hybrid automobile of this embodiment comprises two power source systems. One is a high voltage (42 v) system power source. The other is a low voltage (14 v) system power source. The high voltage system power source is used as the power source for the motor generator M/G as well as the power source for drive units such as the injector, the slot valve, the ignition unit and the intake and discharge valve which are component devices of the engine ENG and includes the high voltage battery BA1. The low voltage system power source is used as a drive power source for the starter STR which starts the engine ENG, as well as the drive power source for the radio, the lights and the like, and the drive power source for the engine control unit ECU, the transmission control unit TCU, the motor control unit MCU, the battery control unit BCU and the general control unit GCU and includes a low voltage battery BA2.

The high voltage battery BA1 is a lithium ion battery with battery voltage of 36 v. A lead battery or a hydrogen ion battery with the same battery voltage may be used as the high voltage battery BA1. The low voltage battery BA2 is a lead battery with a battery voltage of 12 v. A lithium ion battery or a hydrogen ion battery with the same battery voltage may be used as the low voltage battery BA2.

The high voltage battery BA1 (high voltage system power source) is electrically connected to the input (direct current) side of the inverter unit INV. As a result, the high voltage battery BA1 (high voltage system power source) and the inverter unit INV can alternately send and receive direct current. In the case where the motor generator M/G operates as a motor, the direct current that is stored in the high voltage battery BA1 (high voltage system power source) is supplied to the inverter unit INV and converted to three-phase AC power. In the case where the motor generator M/G operates as a generator, the direct current that is output from the inverter is supplied to a high voltage electric load and consumed as drive power and also supplies and charges the high voltage battery BA1.

The low voltage battery BA2 (low voltage system power source) is electrically connected to the high voltage battery BA1 (high voltage system power source) via the DC-DC converter DCC in both directions. As a result, the low voltage battery BA2 (low voltage system power source) and the high voltage battery BA1 (high voltage system power source) can change the voltage level of the DC power for each other and send and receive this power. In the case where low voltage AC power is supplied to a low voltage electrical load, when the low voltage battery BA2 is charged, the DC power supplied from the high voltage battery BA1 (high voltage system power source) is lowered by the DC-DC converter DCC and supplied to the low voltage battery BA2. In the case where backup and the like for the high voltage battery BA1 (high voltage system power source) is needed, the voltage of the DC power supplied from the low voltage battery BA2 (low voltage system power source) is made higher by the DC-DC converter DCC, and supplied to the high voltage battery BA1 (high voltage system power source).

Charging and shelf life of the high voltage battery BA1 and the low voltage battery BA2 are managed by the battery control unit BCU. The voltage value and the current value and the like of the high voltage battery BA1 and the low voltage battery BA2 are input into the battery control unit BCU in order to manage the charging and lifespan of the battery and the like.

The DC-DC converter DCC comprises a semiconductor module, a reactor and a drive circuit device (none of which are shown). The module comprises a voltage regulating circuit switch for increasing and decreasing the DC power from the DC-DC converter DCC, and has a plurality of switching semiconductor elements. The reactor is a magnet element comprising a magnetic energy storage section which is a voltage regulating circuit, and has two windings wound into a circular magnetic core. The drive circuit unit comprises the DC-DC converter DCC and generates drive signals for switch operation (ON/OFF) of the plurality of switching semiconductor elements based on the control signals output from the control unit (not shown), and the drive signals are output to the power semiconductor element of the module. The control unit which outputs control signals to the drive circuit unit may be incorporated into the DC-DC converter DCC or into the battery control unit BCU.

The engine control unit ECU, the transmission control unit TCU, the motor control unit MCU and the battery control unit BCU are electrically connected to each other via an on-vehicle local area network (LAN) and are also electrically connected to the general control unit (GCU). As a result, signal transmission in both directions is possible between control units and thus it becomes possible to transmit information to each other and to share detection values and the like. The general control unit (GCU) calculates the torque value required for the vehicle in accordance with the extent to which the accelerator is pressed based on acceleration desired by the driver. This required torque value is divided into the output torque value for the engine ENG side and the output torque value for the motor generator M/G side such that the driving efficiency of the engine ENG is improved. The divided engine ENG side output torque value is output as the engine torque command signal to the engine control unit ECU, while the divided motor generator M/G side output torque value is output as the motor torque command signal output to the motor control unit MCU.

Next, the operation of the hybrid automobile of this embodiment will be described.

The hybrid automobile of this embodiment has a plurality of operation modes. The operation of the two driving power systems is controlled based on the respective operation mode.

Starting Mode 1 (Initial Start Mode);

The start mode 1 is the operation mode in which the engine ENG is cold started by turning on the ignition switch in the case where the engine ENG is in a low temperature state (when the cold water temperature TC of the engine ENG is less than a prescribed temperature Ts).

When the ignition switch is turned on, DC power from the low voltage battery BA2 is supplied to the starter STR. As a result, the starter STR generates rotational drive force, and the rotational drive force is transmitted to the crankshaft of the engine ENG and the engine ENG thereby starts. When the engine ENG starts, the mixed gases in the cylinder are compressed due to the rotation of the crankshaft and then ignited by the ignition device. When the mixed gases ignite and detonate, the engine ENG itself generates rotational force.

It is to be noted that in this embodiment, the case is described in which in the start mode 1, the engine is started by the starter STR. The motor generator M/G may also be used as for starting the engine ENG. In this case, the motor generator M/G operates the inverter unit INV in accordance with the rotation frequency command signals output from the general control unit (GCU) and controls the operation as is the case in the start mode 2 which is described hereinafter.

Start Mode 2 (Restart Mode);

The start mode 2 is the mode in which the engine ENG is restarted (hot start) when the vehicle is about to move after the operation of the engine ENG is stopped while the vehicle stops for a traffic signal and the like in the case where the engine ENG is in a high temperature state and the ignition switch is on.

When the move-off signal from the driver (such as a signals indicating release of the brake) is input into the general control unit GCU, the general control unit GCU outputs rotation frequency command signals to the motor control unit MCU. The motor control unit MCU calculates the control value for operating the power semiconductor elements of the power modules PM1 and PM2 based on rotation frequency command signals output from the general control unit GCU. The control value is output to the drive circuit unit DU1 as the control signals. The drive circuit unit DU1 generates drive signals for operating the power semiconductor elements of the power modules PM1 and PM2 based on the control signals output from the motor control unit MCU. The drive signals are output to the power module PM1 and the drive circuit unit DU2. The drive circuit unit DU2 outputs drive signals output from the drive circuit unit DU1 to the power module PM2.

The power semiconductor elements of the power modules PM1 and PM2 perform the switching operation (ON/OFF) based on the drive signals output from the drive circuit units DU1 and DU2. As a result, the power modules PM1 and PM2 convert the DC power supplied from the high voltage battery BA1 to three-phase AC power, and this is output to the stator MST of the motor generator M/G. The motor generator M/G operates as a motor and generates rotational drive force corresponding to the three-phase AC power output from the power modules PM1 and PM2. The rotational drive force of the motor generator M/G is transmitted to the crankshaft of the engine ENG and as a result, the engine ENG is restarted. The operation of the engine ENG is the same as in start mode 1.

Stop Mode 1 (Vehicle Stop Mode);

The stop mode 1 is the operation mode in which the operation of the engine ENG is stopped when the ignition switch is off.

Stop Mode 2 (Idle Stop Mode);

The stop mode 2 is the operation mode in which the operation of the engine ENG (idling) is stopped when the vehicle stops for a traffic light and the like and the ignition switch is on, the accelerator is not being pressed, the speed of the vehicle is zero and the charge amount VBc of the high voltage battery BA1 is less than a prescribed value VB.

In the case where the drive conditions of the stop mode 2 are met at the time of stopping, the general control unit GCU outputs engine stop command signals to the to the engine control unit ECU. As a result, the operation of the engine ENG is stopped. Drive conditions for the stop mode 2 such as the condition that the cool water temperature Tc of the engine ENG is greater than a prescribed temperature Ts, or that the angle of incline θ of the vehicle body when stopped is less than a prescribed angle θs may be set. In the case where the drive conditions for the stop mode 2 are not satisfied at the time of stopping, the operation of the engine ENG in the idling state is continued. In the stop mode 2, if the peripherals of the drive source for the engine ENG such as the air conditioner compressor and the like are driven, the motor generator M/G operates as the drive source for the peripherals, and the peripherals are operated by the rotational drive force output by the motor generator M/G.

Engine Running Mode;

The engine running mode is the operation mode in which the vehicle is driven by rotational drive force that is output from the engine ENG in the case where the required torque τd is less than the target torque τa (the extent to which the accelerator is pressed is small) and the charge amount of the VBc of the high voltage battery BA1 exceeds a prescribed value VBh. In this case, the prescribed value VBh is a larger value than the prescribed value VB1.

The general control unit GCU outputs torque command signals and to the motor control unit MCU and the engine control unit ECU in the case where the drive conditions for the engine running mode are met. In this case, the torque command signal output from the general control unit GCU to the motor control unit MCU is 0. As a result, the rotational drive force output from the motor generator M/G is also 0. On the other hand, the torque command signal output from the general control unit GCU to the motor control unit MCU is a signal of a value equivalent to the engine rotation frequency corresponding to required torque τd. The engine control unit ECU generates signals for controlling each component device of the engine ENG based on the torque command signals output from the general control unit GCU, and this is output to the drive unit of the component devices of the engine ENG. As a result, the operation of the component devices of the engine ENG is controlled, and the air-fuel ratio of the mixed gases in the engine ENG and the like is controlled and rotational drive force corresponding to the required torque τd is output from the engine.

Engine Running and Generation Mode;

The engine running and generation are the operation mode in which the vehicle is driven by the rotational drive force output from the engine ENG and the motor generator M/G is rotated and driven by the rotational drive force output from the engine ENG and the motor generator M/G operates as a generator. This occurs in the case where the required torque τd is less than the target torque τa (when the extent to which the accelerator is pressed is small) and the charge amount VBc of the high voltage battery BA1 is less than the prescribed value VBh and in addition, when the required torque τd is greater than the target torque Ta (when the extent to which the accelerator is pressed is large) and the charge amount VBc of the high voltage battery BA1 is less than the prescribed value VB1.

In the case where the drive conditions of the engine running and generation mode are met, the general control unit GCU outputs torque command signals to the motor control unit MCU and the engine control unit ECU. In this case, the torque command signals output to the motor control unit MCU from the general control unit GCU are signals for generating prescribed rated power at the motor generator M/G, and are negative signals in the opposite direction from the torque command signals for generating the rotational drive force. The motor control unit MCU calculates the control value for operating the power semiconductor elements of the power modules PM1 and PM2 based on torque command signals output from the general control unit GCU. The control value obtained by this calculation is output to the drive circuit unit DU1 as the control signals. The drive circuit unit DU1 generates drive signals for operating the power semiconductor elements of the power modules PM1 and PM2 based on the control signals output from the motor control unit MCU and the drive signals are output to the power module PM1 and the drive circuit unit DU2. The drive circuit unit DU2 outputs drive signals output from the drive circuit unit DU1 to the power module PM2.

The power semiconductor elements of the power modules PM1 and PM2 perform the switching operation (ON/OFF) based on the drive signals output from the drive circuit units DU1 and DU2. As a result, the power modules PM1 and PM2 convert power to DC power using the three-phase AC power supplied from motor generator M/G and this is output to the high voltage battery BA1 (high voltage system power source). The DC power supplied to the high voltage battery BA1 (high voltage system power source) is consumed as drive power for high voltage electrical load and also charges the high voltage battery BA1.

The torque command signal output from the general control unit GCU to the engine control unit ECU is a signal of value in which the value of the torque required at the motor generator M/G is added to the value equivalent to the engine rotation frequency corresponding to required torque 1d. The engine control unit ECU generates signals for controlling each component device of the engine ENG based on the torque command signals output from the general control unit GCU, and this is output to the drive unit of the component devices of the engine ENG. As a result, the operation of the component devices of the engine ENG is controlled, and the air-fuel ratio of the mixed gases in the engine ENG and the like is controlled and rotational drive force corresponding to the required torque τd and the rotational drive force required at the motor generator M/G are output from the engine ENG.

Acceleration Mode;

The acceleration mode is the operation mode in which the vehicle moves due to the rotational drive force output from the engine ENG and the motor generator M/G in the case where the required torque τd is greater than the target torque Ta and the charge amount VBc of the high voltage battery BA1 is greater than the prescribed value VBL.

In the case where the drive conditions for the acceleration mode are met, the general control unit GCU outputs torque command signals to the motor control unit MCU and the engine control unit ECU. The torque command signals output to the motor control unit MCU from the general control unit GCU are torque control signals corresponding to the required torque τde at the engine ENG side τde and control signals corresponding to required torque τdm at the motor generator M/G side τdm. The required torque τde and the required torque τdm are formed by dividing the required torque τd in accordance with the operating efficiency of the engine ENG. In this embodiment, the required torque td is divided into the required torque τde and the required torque τdm in order to increase the operating efficiency of the engine ENG. Torque command signals corresponding to required torque τdm are output to the motor control unit MCU. The motor control unit MCU calculates the control value for operating the power semiconductor elements of the power modules PM1 and PM2 based on torque command signals output from the general control unit GCU. The control value obtained by the calculation is output to the drive circuit unit DU1 as the control signals. The subsequent operation of the electric power train side is the same as the foregoing description in start mode 2. Torque command signals corresponding to required torque τde are output to the engine control unit ECU. The subsequent operation of the engine power train side is the same as the foregoing description in the engine running mode or the engine running and generation mode.

Regeneration Mode;

The regeneration mode is the operation mode in which the wheel movement (rotation) energy is transmitted to the motor generator M/G and the motor generator M/G is rotated and thereby driven and operates as a generator in the case where the ignition key switch is on, the accelerator is not being pressed, the vehicle speed is more than zero and the charge amount VBc of the high voltage battery BA1 is less than the prescribed value VBh.

In the case where the drive conditions of the regeneration mode are met, the general control unit GCU outputs torque command signals to the motor control unit MCU and the engine control unit ECU. The torque command signals output to the motor control unit MCU from the general control unit GCU are signals for generating prescribed rated power at the motor generator M/G, and are opposite negative signals of the torque command signals for generating the rotational drive force. The operation of the electric power train side is the same as the foregoing description in the engine running and generation mode. The torque command signals output to the engine control unit ECU to the general control unit GCU is zero. As a result, the rotational drive force output from the engine ENG is also zero.

In this embodiment, the operation of the hybrid automobile is described using an example in which the motor generator M/G is disposed at the engine ENG side, and the engine ENG and the motor generator M/G are mechanically connected by a belt BEL. The motor generator M/G is disposed at a location between the engine ENG and the transmission T/M. In this case, the crankshaft of the engine ENG and the rotating shaft of the motor generator M/G are directly mechanically connected or mechanically connected via a fastening mechanism such as a clutch or the like. This type of configuration is favorable for the hybrid automobile in which the motor generator M/G is a drive source for the engine ENG as well as for the vehicle and the battery has a high voltage of 200 v or more. In terms of operation, the motor generator M/G is used as the drive source in the low speed region to the medium speed region of the vehicle. In the high speed region of the vehicle, the engine ENG is used as the drive source. When there is a great load such as when the vehicle is accelerating or climbing a slope, the motor generator M/G and the engine ENG are both used as the drive source.

In addition, in this embodiment, the case is described in which the motor generator M/G and the inverter INV are formed separately, but the motor generator M/G and the inverter INV may be integrally formed as one unit. In this case, the inverter unit INV is built in at the axial direction one end side of the motor generator M/G (the axial direction end opposite to the pulley MPU side). Also, the inverter unit INV may be disposed at the outer periphery upper portion or the outer periphery lower portion or the outer periphery side portion and the case for both may be integrally formed. The configuration that is used should be determined by the space for mounting, but the former conserves space more than the latter.

Next, the electrical circuit configuration of the inverter unit INV of this embodiment will be described using FIG. 3 through FIG. 7.

As described in the foregoing, the inverter INV of this embodiment largely comprises a motor control unit MCU, the drive circuit units DU1 and DU2 and the power modules PM1 and PM2.

It is to be noted that in FIGS. 3 to 7, the power source system and the power system are drawn using solid lines and the lines for the control systems are drawn with broken lines and arrows respectively in order to make the distinction between the lines of the power source system and the power system and the lines of the control system clear.

First, the circuit configuration of the power modules PM1 and PM2 will be described.

The power modules PM1 and PM2 comprise a main circuit for power conversion, and operate by receiving drive signals output from the corresponding drive circuit devices DU1 and DU2, convert the DC power supplied from the high voltage battery BA1 to three-phase AC power, and supplies it to the stator winding of the motor generator M/G. The main circuit is a bridge circuit and a plurality of serial circuits is electrically connected in parallel between the positive pole and the negative pole of the high voltage battery BA1. The serial circuit is also called an arm and each comprises two semiconductor elements. In this embodiment, the bridge circuit comprises 6 arms.

The arm is formed by electrically connecting in serial the power semiconductor element of the upper arm and the power semiconductor element of the lower arm. In this embodiment, a MOSFET (metal oxide semiconductor field effective transistor) which is a switching semiconductor is used as the semiconductor element. The semiconductor chip comprising the MOSFET has three electrodes which are the drain electrode, source electrode and gate electrode. Parasitic diodes whose forward direction is the direction from the source electrode toward the drain electrode are electrically connected between the source electrode and the gate electrode of the MOSFET.

The power semiconductor element may use IGBT (insulated gate bipolar transmitter) in place of the MOSFET. In the case where the IGBT is used, it is necessary to electrically connect a separate diode element between the collector electrode and the emitter electrode.

The source electrodes for the power semiconductor element MU1 (MU3, MV1, MV3, MW1, MW3) and the drain electrodes for the power semiconductor element MU2 (MU4, MV2, MV4, MW2, MW4) are electrically connected in serial to thereby comprise the u1 phase arm AU1 (u2 phase arm AU2, v1 phase arm AV1, v2 phase arm AV2, w1 phase arm AW1, w2 phase arm Aw2).

The power semiconductor elements MU1-MU4, MV1 and MV2 comprising u1 phase arm AU1, u2 phase arm AU2, and v1 phase arm AV1 form the bridge circuit of the power module PM1. The power semiconductor elements MV3 and MV4, and MW1-MW4, comprising v2 phase arm Av2, w1 phase arm AW1, and w2 phase arm AW2, form the bridge circuit of the power module PM2.

The drain electrodes of the power semiconductor elements MU1, MU3, MV1, MV3, MW1, and MW3 are electrically connected to the high potential side (positive pole side) of the high voltage battery BA1. The source electrodes of the power semiconductor elements MU2, MU4, MV2, MV4, MW2, and MW4 are electrically connected to the low potential side (negative pole side) of the high voltage battery BA1.

The middle point (the connection portion between the source electrode of the upper arm side power semiconductor element and the drain electrode of the lower arm side power semiconductor element for each arm) of u1 phase arm AU1 (v1 phase arm AV1, w1 phase arm AW1) and middle point (the connection portion between the source electrode of the upper arm side power semiconductor element and the drain electrode of the lower arm side power semiconductor element for each arm) of u2 phase arm AU2 (v2 phase arm AV2, w2 phase arm AW2) are electrically connected in parallel and also electrically connected to the u phase (v phase and w phase) stator winding of the motor generator M/G.

In this embodiment, a plurality of arms for each phase is electrically connected in parallel between the positive pole and the negative pole of the high voltage battery BA1, and the middle point of two arms is electrically connected in parallel for each phase and this point is electrically connected to the corresponding phase of the stator winding of the motor generator M/G. As a result, in this embodiment, the phase current for each phase can be separately channeled into two arms and the current flowing to one power semiconductor element can be reduced. Thus in this embodiment, current loss or generation of heat due to large currents can be reduced.

A smoothing electrolytic condenser SEC is electrically connected between the positive pole and negative pole of the high voltage battery BA1 in order to control the variation of the direct current voltage caused by operation of the power semiconductor element.

Next, the circuit configuration and the signal system configuration of the drive circuit units DU1 and DU2 will be described.

Figure 4:
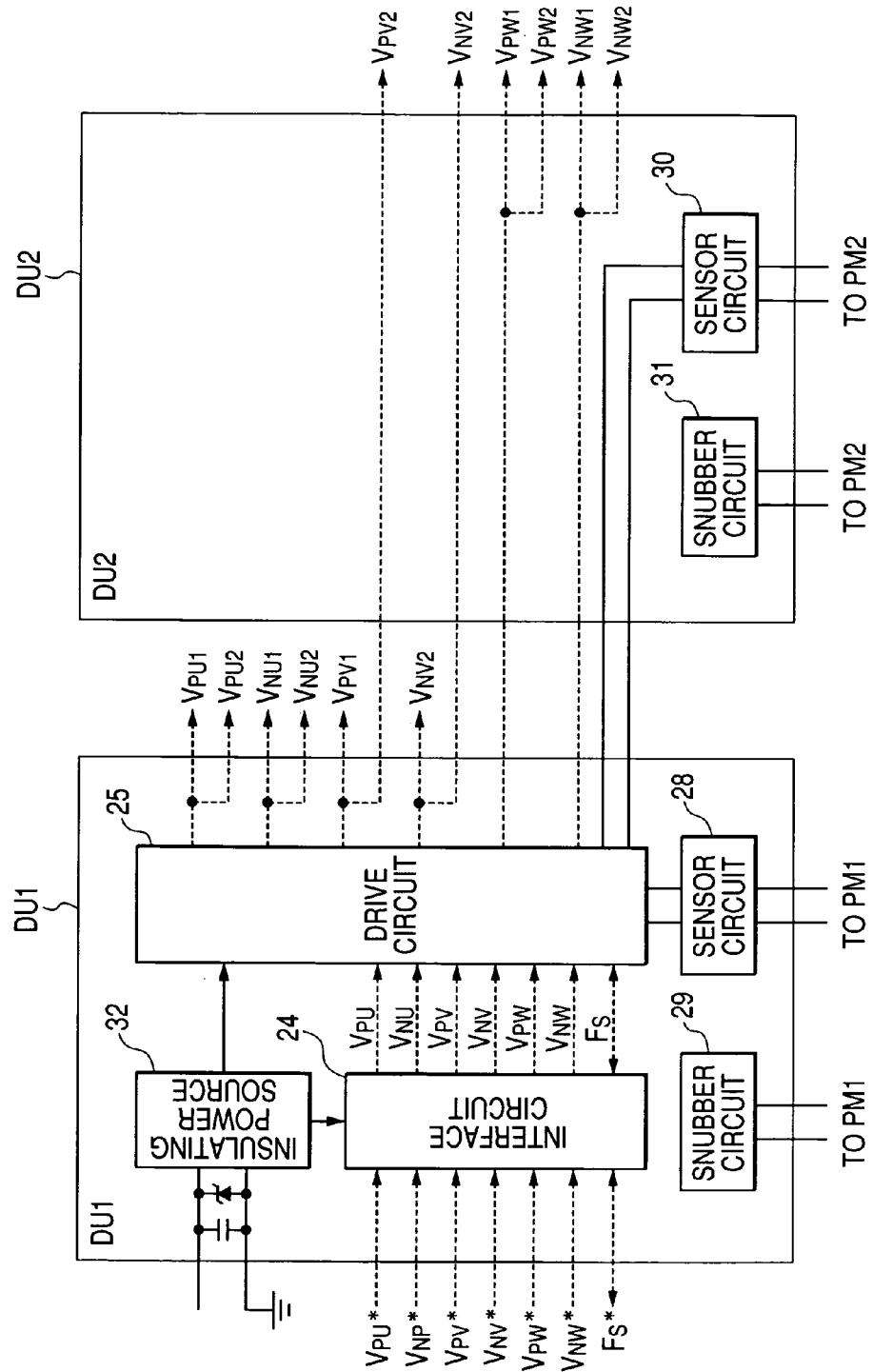
FIG. 4 is a block diagram showing the circuit configuration and the signal system configuration of the drive circuit unit of FIG. 3.

As shown in FIG. 4, the drive circuit unit DU1 has an insulating power source 32 comprising a plurality of circuits and operating power sources. The insulating power source 32 is a transformer and the low voltage battery BA2 is connected to the primary side (high voltage side) thereof, while a circuit needed for the operating power source is electrically connected to the secondary side (low voltage side) thereof. The plurality of circuits includes a drive circuit 25, an interface circuit 24, a sensor circuit 28 and a snubber circuit 29. Of these, the power source voltage necessary for circuit operation is applied to the drive circuit 25, the interface circuit, and the interface circuit 24 from the insulating power source 32.

The interface circuit 24 is a signal transmission circuit which is between the motor control unit MCU and the drive circuit 25, and the control signals VPu*-VNw* which are output from the motor control unit MCU is output to the drive circuit 25 as the drive signal VPu-VNw for driving the power semiconductor elements. The control signals VPu*-VNw* and the drive signals VPu-VNw are signals with the same signal level (for example, high level signals for turning on the power semiconductor element), and signals with different voltage level (for example, the control signal is a signal with a signal voltage level of 5 v and the drive signal has a signal voltage level of 12 v).

The control signals VPu*-VNw* that are output from the motor control unit MCU are six control signals corresponding to the two upper and lower power semiconductor elements of one of the two arms of each phase. For example, the control signal VPu* (VPv*, VPw*) corresponds to the power semiconductor element MU1 (MV1, MW1) of the u1 phase arm AU1 (v1 phase arm AV1, w1 phase arm AW1). The control signal VNu* (VNv*, VNw*) corresponds, for example, to the power semiconductor element MU2 (MV2, MW2) of the u1 phase arm AU1 (v1 phase arm AV1, w1 phase arm AW1). Also, in the case where drive signals VPu-VNw are output from the interface circuit 24, they correspond to two upper and lower power semiconductor elements of one of the two arms of each phase.

The drive circuit 25 outputs final drive signals VPu-VNw which are supplied to the gate electrodes of the two upper and lower power semiconductor elements of one of the two arms of each phase. The drive circuit 25 also detects abnormalities such as excess current or excess voltage and protects the power semiconductor elements of the power modules PM1 and PM2 from excess current and excess voltage.

In this embodiment in which the main circuit comprises two arms for each phase, and the current for each phase is separated to two arms for each phase, the upper arm side power semiconductor elements of the two arms of each phase are operated in the same manner using the same drive signals, and the lower arm side power semiconductor elements are operated in the same manner using the same drive signals. For example, in the case of the U phase, the power semiconductor elements MU1 and MU3 are caused to operate (for example, turned on) in the same manner using the same drive signal VPu and the power semiconductor elements MU2 and MU4 are caused to operate (for example, turned off) in the same manner using the same drive signal VNu.

As a result, in this embodiment, the wire path of each of the drive signals is physically separated into two arms for each phase and the drive signals VPu-VNw that are output from the drive circuit 25 are electrically branched into the two respective arms. At the drive circuit DU1, the drive signals VPu, VNu, VPv, and VNv from among the drive signals VPu-VNw which are necessary for operating the power semiconductor elements of the power module PM1 are electrically separated after being output from the drive circuit 25. The drive signal VPu electrically branches into drive signals VPu1 and VPu2; drive signal VNu electrically branches into drive signals Vnu1 and VNu2; drive signal VPv electrically branches into drive signals VPv1 and VPv2; and drive signal VNv electrically branches into drive signals VNv1 and VNv2.

The electrically branched signals VPu1, VPu2, VNu1, VNu2, VPv1, and VNv1 are supplied from the drive circuit unit DU1 to the power semiconductor elements corresponding to the power module PM1. The drive signal Vpu1 is supplied to the gate electrode of the power semiconductor element MU1; the drive signal VPu2 is supplied to the gate electrode of the power semiconductor element MU3; the drive signal VNu1 is supplied to the gate electrode of the power semiconductor element MU2; the drive signal VNu2 is supplied to the gate electrode of the power semiconductor element MU4; the drive signal VPv1 is supplied to the gate electrode of the power semiconductor element MV1; and the drive signal VNv1 is supplied to the gate electrode of the power semiconductor element MV2.

The electrically branched drive signals VPv2 and VNv2 are transmitted via signal wires from the drive circuit unit DU1 to the drive circuit unit DU2 along with the other drive signals VPw and VNw.

The sensor circuit 28 comprises a plurality of current detection elements and is provided for detecting current which flows in the power semiconductor elements of the power module PM1. The current detection element is a low resistance element that is electrically connected in parallel to the source electrode side of each of the power semiconductor elements. The voltage (detection signal) at both ends of the low resistance element is output to the drive circuit 25 from the sensor circuit 28. The drive circuit 25 detects the current flowing in each of the power semiconductor elements based on the voltage output from the sensor circuit 28. As a result, the protection of the power semiconductor elements from excess current can be performed by excess current detection. It is to be noted that in this embodiment, the output of the sensor 28 is shown by one set of two solid lines, but in reality six sets of twelve corresponding to each power semiconductor element are input to the drive circuit 25.

The snubber circuit 29 is one of the protective circuits for the power semiconductor elements and protects the power semiconductor elements from abnormal voltage generated due to the effect of stray inductance on the main circuit when the switching operation of the power semiconductor elements is performed. The snubber circuit 29 comprises a plurality of circuit elements such as low resistance elements and diode elements and is electrically connected in parallel between the drain sources the power semiconductor elements of the power module PM1.

As shown in FIG. 4, the drive circuit unit DU2 comprises the sensor circuit 30 and the snubber circuit 31. The drive signals for operating the power semiconductor elements of the power module PM2 are the drive signals VPv2, VNv2, VPw, and VNw which are transmitted from the drive circuit unit DU1. Thus at the drive circuit unit DU2, the interface circuit 24 and the drive circuit 25 are omitted.

In this embodiment, because the interface circuit 24 and the drive circuit 25 are provided only at the power module PM1, the configuration of the drive circuit unit DU2 can be simple and the cost of the inverter unit INV is reduced. In other words, in this embodiment, if there are two or more power modules, there is no need to set the number of drive circuits and interface circuits in accordance with the number of power modules.

The drive signal VPv2 which is output from the drive circuit unit DU1 is supplied to the gate electrode of the power semiconductor element MV3 via the drive circuit unit DU2, while drive signal VNv2 is supplied to the gate electrode of the power semiconductor element MV4 via the drive circuit unit DU2. At the drive circuit unit DU2, the drive signal VPw is electrically branched into the drive signals VPw1 and VPw2 while the drive signal VNw is electrically branched into the drive signals VNw1 and VNw2. The drive signal VPw1 is supplied to the gate electrode of the power semiconductor element MW1 while the drive signal VPw2 is supplied to the gate electrode of the power semiconductor element MW3. The drive signal VNw1 is supplied to the gate electrode of the power semiconductor element MW2 while the drive signal VNw2 is supplied to the gate electrode of the power semiconductor element MW4.

The sensor circuit 30 is provided for detecting current which flows in the power semiconductor elements of the power module PM2, and has the same configuration as the sensor circuit 28. The sensor circuit 30 outputs voltage (detection signal) at both ends of the low resistance element. The voltage output from the sensor circuit 30 is transmitted to the drive circuit unit DU1 from the drive circuit unit DU2 and input to the drive circuit 25. The drive circuit 25 detects the current flowing in each of the power semiconductor elements of the power module PM2 based on the voltage output from the sensor circuit 30. It is to be noted that in this embodiment, the output of the sensor 30 is shown by one set of two solid lines as is the case for sensor 28, but in reality six sets of twelve corresponding to each power semiconductor element are transmitted from the drive circuit unit DU2 to the drive circuit unit DU1 and input to the drive circuit 25.

As is the case with the snubber circuit 29, the snubber circuit 31 is provided to protect the power semiconductor elements of the power module PM2 from abnormal voltage and comprises a plurality of circuit elements such as low resistance elements and diode elements and are electrically connected in parallel between the drain sources the power semiconductor elements of the power module PM2.

Next, the configuration of the power source system of the drive circuit units DU1 and DU2 will be described.

Figure 5:
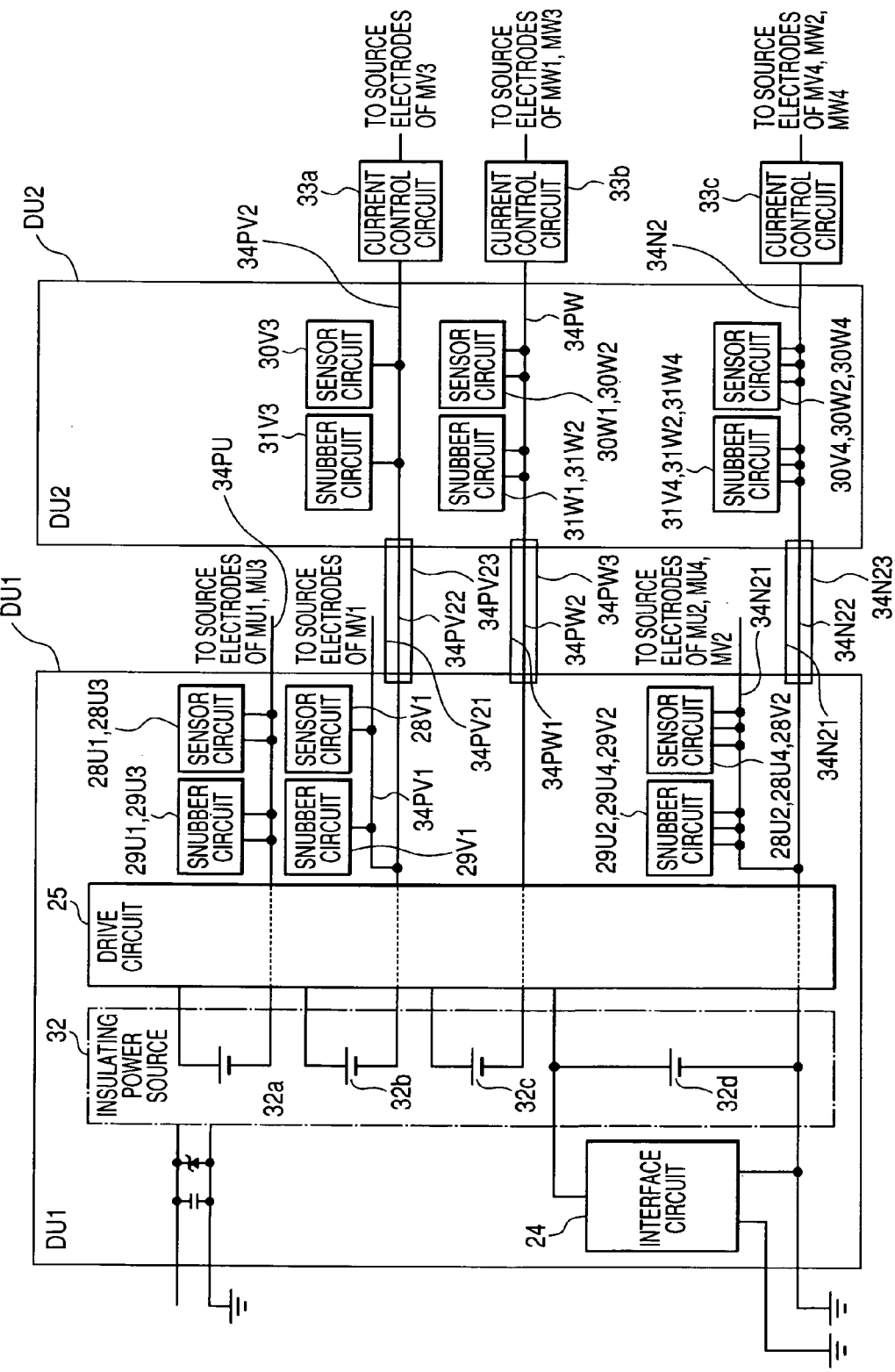
FIG. 5 is a block diagram showing the configuration of the power source system of the drive circuit unit of FIG. 3.

The insulating power source 32 comprises four power sources as shown in FIG. 5 and these are the power source 32a which corresponds to the u phase upper arm the power source 32b which corresponds to the v phase upper arm, the power source 32c which corresponds to the w phase upper arm and the power source 32d which is shared for the lower arms of the u phase to w phase. The high potential side and the low potential side of the power sources power sources 32a-32d are electrically connected to the drive circuit 25. The power source voltage of the power sources 32a-32c is applied to the upper arm drive circuits (described hereinafter using FIG. 6) of the corresponding phase. The power source voltage of the power source 32c is applied in common to the lower arm drive circuits (described hereinafter using FIG. 6) and also applied to the control logic circuit and the protective circuit (both described hereinafter using FIG. 6). In addition, the power source voltage of the power source 32c is applied to the interface circuit 32c.

A reference potential wire (or a GND line) 34Pu is electrically connected to the low potential side (reference potential side) of the power source 32a; to the low potential side (reference potential side) of the u phase upper arm drive circuit; and to the source electrodes (the electrodes which will represent the reference potential side of u phase upper arm drive circuit) of the power semiconductor elements Mu1 and Mu3. One end side of the sensor circuits (current detection elements) 28u1 and 28u3 and one end side (source electrode connection side) of the snubber circuits 29u1 and 29u3 which are provided so as to correspond with the power semiconductor elements Mu1 and Mu3 are electrically connected to the reference potential wire 34Pu.

A reference potential wire (or a GND line) 34Pv is electrically connected to the low potential side (reference potential side) of the power source 32b; to the low potential side (reference potential side) of the v phase upper arm drive circuit; and to the source electrodes (the electrodes which will represent the reference potential side of v phase upper arm drive circuit) of the power semiconductor elements Mv1 and Mv3.

The reference potential wire 34Pv is formed such that the reference potential wire 34Pv1 which is electrically connected to the power semiconductor element Mv1 side and the reference potential wire 34Pv2 which is electrically connected to the power semiconductor element Mv3 side is electrically connected in parallel. One end side of the sensor circuit (current detection elements) 28v1 and one end side (source electrode connection side) of the snubber circuits 29v1 which are provided so as to correspond with the power semiconductor element Mv1 are electrically connected to the reference potential wire 34Pv1. The reference potential wire 34Pv2 spans from the drive circuit unit DU1 to the drive circuit unit DU2, and one end side of the sensor circuit (current detection elements) 30v3 and one end side (source electrode connection side) of the snubber circuit 31v3 which are provided so as to correspond with the power semiconductor elements Mv3 are electrically connected.

A reference potential wire (or a GND line) 34Pw is electrically connected to the low potential side (reference potential side) of the power source 32c; to the low potential side (reference potential side) of the w phase upper arm drive circuit; and to the source electrodes (the electrodes which will represent the reference potential side of w phase upper arm drive circuit) of the power semiconductor elements Mw1 and Mw3. The reference potential wire 34Pw spans from the drive circuit unit DU1 to the drive circuit unit DU2, and one end side of the sensor circuits (current detection elements) 30w1 and 30w3 and one end side (source electrode connection side) of the snubber circuits 31w1 and 31w3 which are provided so as to correspond with the power semiconductor elements Mw1 and Mw3 are electrically connected.

A reference potential wire (or a GND line) 34N electrically interconnects the low potential side (reference potential side) of the power source 32d; the low potential side (reference potential side) of each of the u phase to the w phase lower arm drive circuits; the source electrodes (the electrodes which will represent the reference potential side of lower arm drive circuit for each phase) of the power semiconductor elements Mu2, Mu4, Mv2, Mv4, Mw2, and Mw4; and the low potential side (reference potential side) of the interface circuit 24. The reference potential wire 34N is formed such that the reference potential wire 34N1 which is electrically connected to the power semiconductor elements Mu2, Mu4, and Mv2 and the reference potential wire 34N2 which is electrically connected to the power semiconductor elements Mv4, Mv2, and Mw4 are electrically connected in parallel, and grounded in the same manner as the DC low potential side of the power modules PM1 and PM2 and the high voltage battery BA1. One end side of the sensor circuits (current detection elements) 28u2, 28u4, and 28v2 and one end side (source electrode connection side) of the snubber circuits 29u2, 29u4, and 29v2 which are provided so as to correspond with the power semiconductor elements Mu2, Mu4, and Mv2 are electrically connected to the reference potential wire 34N. The reference potential wire 34N2 spans from the drive circuit unit DU1 to the drive circuit unit DU2 and one end side of the sensor circuits (current detection elements) 30v4, 30w2, and 30w4 and one end side (source electrode connection side) of the snubber circuits 31v4, 31w2, and 31w4 which are provided so as to correspond with the power semiconductor elements Mv4, Mw2, and Mw4 are electrically connected to the reference potential wire 34N2. In addition, the low potential side (reference potential side) of the interface circuit 24 is electrically connected to the low potential side (reference potential side) of the grounded motor control unit MCU, by a reference potential wire which is different from the reference potential wire 34N The reference potential wires 34Pv2, 34Pw2, and 34N2 which span from the drive circuit unit DU1 to the drive circuit unit DU2 are formed such that the current cross-section area of the portion that spans or extends the drive circuit unit DU1 and the drive circuit unit DU2 is greater than the current cross-section area for the other portions. This type of configuration becomes possible by making the number of wires for the portion of the reference potential wires 34Pv2, 34Pw, and 34N2 that span the drive circuit unit DU1 and the drive circuit unit DU2 more than the number of wires for the other portions. In this embodiment, the portion of the reference potential wire 34Pv2 that spans the drive circuit unit DU1 and the drive circuit unit DU2 is formed by electrically connecting three reference potential wires 34Pv21-34Pv23 in parallel. The portion of the reference potential wire 34Pw that spans the drive circuit unit DU1 and the drive circuit unit DU2 is formed by electrically connecting in parallel, three reference potential wires 34Pw1-34Pw3. The portion of the reference potential wire 34PN2 that spans the drive circuit unit DU1 and the drive circuit unit DU2 is formed by electrically connecting in parallel, three reference potential wires 34PN1-34PN3. The other portions of the reference potential wires 34Pv2, 34Pw, and 34N2 respectively are one single wire.

As described above, in this embodiment, the number of wires for the portion of the reference potential wires 34Pv2, 34Pw, and 34N2 that span the drive circuit unit DU1 and the drive circuit unit DU2 is greater than the number of wires for the other portions. This is for the reasons described in the following. Namely, in this embodiment, the power semiconductor elements of the power module PM2 are driven by using the drive signals transmitted from the drive circuit unit DU1 to the drive circuit unit DU2. Thus, the wire distance of the signal transmission path from the drive circuit 25 to the power module PM2 is longer than the wire distance of the signal transmission path from the drive circuit 25 to the power module PM1. When the wire distance of the signal transmission path is long, the drive signals output from the drive circuit 25 are likely to be affected by the noise generated by parasitic inductance noise when the switching operation of the power semiconductor element is performed. As a result, the control of the power semiconductor elements of the power module PM2 is lower than the control of the power semiconductor elements of the power module PM1 and thus it is sometimes impossible to simultaneously control the power semiconductor elements of both.

Thus as described above, in this embodiment, the number of wires for the portion of the reference potential wires 34Pv2, 34Pw, and 34N2 that span the drive circuit unit DU1 and the drive circuit unit DU2 is greater than the number of wires for the other portions and the current cross-section area (size of the wire path) for the portion of the reference potential wires 34Pv2, 34Pw, and 34N2 that span the drive circuit unit DU1 and the drive circuit unit DU2 is greater than the current cross-section area (size of the wire path) of the other portions. As a result, in this embodiment, the parasitic inductance of the signal transmission path from the drive circuit 25 to the power module PM2 is reduced. Accordingly, in this embodiment, even if the wire distance of the signal transmission path from the drive circuit 25 to the power module PM2 is long, it is unlikely that the drive circuit 25 will be affected by noise and reduction on the control of the power semiconductor elements of the power module PM2 is limited Furthermore, when the current cross-section area of the portion of the reference potential wires 34Pv2, 34Pw, and 34N2 that span the drive circuit unit DU1 and the drive circuit unit DU2 is large, the impedance of the reference potential wires 34Pv2, 34Pw, and 34N2 becomes proportionately small, and the current flowing in the reference potential wires 34Pv2, 34Pw, and 34N2 is proportionately increased. Thus in this embodiment, current control circuits 33*a*, 33*b*, and 33*c* are provided for each of the reference potential wires 34Pv2, 34Pw, and 34N2 and the amount of current flowing in reference potential wires 34Pv2, 34Pw, and 34N2 is controlled. The current control circuits 33*a*-33*c* comprise current control circuit elements such as resistor elements and the like.

In this embodiment, because the reference potential wires 34Pv2, 34Pw, and 34N2 have the current control circuits 33*a*-33*c*, the increase in the current flow to the reference potential wires 34Pv2, 34Pw, and 34N2 can be controlled.

Also, as described above, in this embodiment, the output from the sensor circuit 30 is transmitted from the drive circuit unit DU2 to the drive circuit unit DU1 and input to the drive circuit 25. Thus the wire distance of the signal transmission path from the sensor circuit 30 to the drive circuit 25 is, as is the case with the wire path of the drive signals, longer than the wire distance of the signal transmission path from the sensor circuit 28 to the drive circuit 25, and as is the case with the wire path of the drive signals, noise problems occur. As a result, even if the same sensor circuits are used for the sensor circuits 28 and 30, and the same current is passed through, there is some deviation in the detection voltage of the sensor circuit 28 and the detection voltage of the sensor circuit 30, and at times, the detection accuracy of the sensor circuit 30 is lower than the detection accuracy of the sensor circuit 28.

Thus, in this embodiment, the time constant for the filter circuits provided at the sensor circuit 30 is larger than the time constant for the filter circuits provided at the sensor circuit 28, and the effect of noise is controlled, and the reduction in detection accuracy is also controlled. In addition, in this embodiment, the determination values for excess current protection are electrically tuned as needed. For example in the drive circuit unit DU1, the determination value of the sensor circuit 30 is tuned such that in the case where the detected voltage for the sensor circuit 28 is 0.5 v or more, a determination is made that there is excess voltage, while in the drive circuit unit DU2, in the case where the detected voltage for the sensor circuit 30 is 0.52 v or more, a determination is made that there is excess voltage and thus the determination value is higher than that for the sensor circuit 28. As a result, in this embodiment, even if the wire distance of the signal transmission path from the sensor circuit 30 to the drive circuit 25 is long, reduction in the detection accuracy of the sensor circuit 30 can be controlled.

It is to be noted that the filter circuit of the sensor circuit may comprise a resistor element, a capacitor element, an inductance element or the like in suitable combinations Furthermore, in this embodiment, the power modules PM1 and PM2 are configured such that the wire distance of the signal transmission path from the drive circuit 25 for each phase to the gate electrode of the power semiconductor element is the same. That is to say, the u phase (w phase) u1 phase arm AU1 (w1 phase arm AW1) and the u2 phase arm AU2 (w2 phase arm AW2) are two adjacent arms in the power module PM1 (PM2) and comprise the arm positioned at the middle of the power module PM1 (PM2) and the arm adjacent to one side of this arm.

It is to be noted that one side of the arm positioned at the middle of the power module PM1 (PM2) refers to the opposite side of the power module PM2 (PM1) which is parallel to the power module PM1 (PM2).

However, the v phase is formed so as to span the two power modules PM1 and PM2. That is to say, the v1 phase arm AV1 and the v2 phase arm AV2 of the v phase comprise arm positioned at the middle of the power module PM1 and the arm adjacent to the other side of the arm positioned at the middle of the power module PM2. As a result, in the v phase, wire distance of the signal transmission path from the drive circuit 25 to the gate electrode of the power semiconductor element is different at the power module PM1 side from the power module PM2 side, and the power module PM2 side is longer than that of the power module PM1 side. As a result, control between the v1 phase arm AV1 and the v2 phase arm AV2 becomes unbalanced, and control of the v2 phase arm AV2 is reduced more than the control of the v1 phase arm AV1, and the current flowing in the v2 phase arm AV2 is smaller than the current flowing in the v1 phase arm AV1. Thus, there is a larger increase in the temperature of the power semiconductor elements at the v1 phase arm AV1 side than that of the power semiconductor elements at the v2 phase arm AV2, and thus decrease in lifespan is greater than for the power semiconductor elements at the v2 phase arm AV2 side.

It is to be noted that the other side of the arm positioned at the middle of the power module PM1 refers to the side of the power module PM2 which is parallel to the power module PM1. The other side of the arm positioned at the middle of the power module PM2 refers to the side of the power module PM1 which is parallel to the power module PM2.

Thus, in this embodiment, the gate resistance at the v phase power semiconductor elements is adjusted such that the current flowing in the v1 phase arm AV1 and the v2 phase arm AV2 of the v phase are substantially equal. More specifically, in this embodiment, the gate resistance of the power semiconductor element of the v1 phase arm AV1 is greater than the gate resistance of the power semiconductor element of the v2 phase arm AV2. As a result, in this embodiment, the current flowing in the v1 phase arm AV1 and the v2 phase arm AV2 is substantially equal.

Next, the circuit configuration of the drive circuit 25 will be described.

Figure 6:
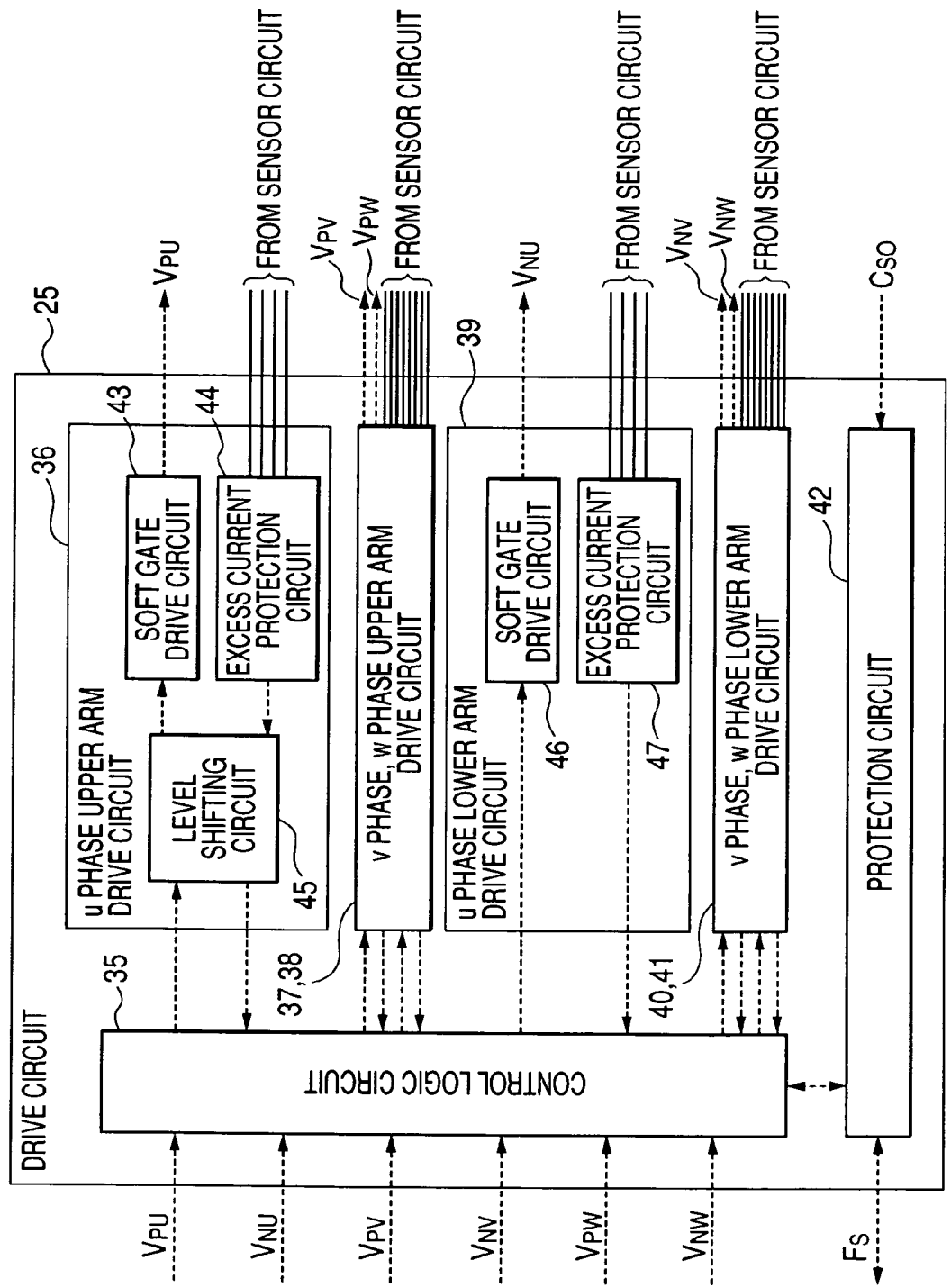
FIG. 6 is block diagram showing the circuit configuration of the drive circuit of FIG. 4.

As shown in FIG. 6, the drive circuit 25 comprises circuits for driving and protecting the power semiconductor elements, and is formed of an integrated circuit unit or IC. The integrated circuit unit has a plurality of circuit elements integrated on one chip, and the outside of the chip is not covered by a mold material. The plurality of leads that is electrically connected to the chip protrudes to the outside from the mold material of the integrated circuit.

The circuits for driving the power semiconductor elements comprise the u phase upper arm drive circuit 36 (v phase upper arm drive circuit 37 and w phase upper arm drive circuit 38) that is provided so as to correspond with one of the two u phase (v phase, w phase) upper arms, and the u phase lower arm drive circuit 39 (v phase upper arm drive circuit 40 and w phase upper arm drive circuit 41) that is provided so as to correspond with one of the two u phase (v phase, w phase) lower arms. In addition, a control logic circuit 35 is provided as the circuit for driving the power semiconductor elements.

The control logic circuit 35 is the circuit which performs logic computations for preventing faulty operation of the power semiconductor elements and performs interlocking for preventing damage of the power semiconductor elements. In addition, the control logic circuit 35 monitors abnormalities of the logic computations for itself as well as abnormalities of the interface circuit 24. The drive signals VPu-VNw output from the interface circuit 24 and the abnormality flag signals output from the circuit for protecting the power semiconductor elements are input to the control logic circuit 35.

An example of the logic computations for preventing faulty operation of the power semiconductor elements is preventing the upper and lower arm power semiconductor elements from turning on simultaneously. This computation is one in which in the case where the control signal for turning on the power semiconductor element MU2 is input when the drive signal for turning on the power semiconductor element MU1 is input, the drive signal for turning on the power semiconductor element MU2 is output as the drive signal for turning off the power semiconductor element MU2, and thus the power semiconductor element MU2 does not come on (the power semiconductor element MU2 remains in the off state).

An example of the interlocking for preventing damage of the power semiconductor elements is one in which the operation of the power semiconductor element is stopped in the case where excess current flows to the power semiconductor element. This interlocking is one in which in the case where excess current flows to the power semiconductor element MU1 when the drive signal for turning on the power semiconductor element MU1 is input, the drive signal for turning on the power semiconductor element MU1, or alternatively, the drive signal for turning on the power semiconductor element MU1 or the drive signals of all the power semiconductor elements are interrupted and the operation of the power semiconductor element MU1 or the operation of all the power semiconductor elements is stopped.

The drive signals VPu-VNw that are output from the control logic circuit 35 are input to the drive circuit of the corresponding arm. The drive signals VPu (VPv, VPw) are input to the u phase upper arm drive circuit 36 (v-phase upper arm drive circuit 37, w phase upper arm drive circuit 38) while the control signal VNu (VNv, VNw) is input to the u phase lower arm drive circuit 39 (v phase lower arm drive circuit 40, phase lower arm drive circuit 41).

At the upper arm drive circuit for each of the phases, the drive signals output from the control logic circuit 35 is input to the level shifting circuit 45. The level shifting circuit 45 is a circuit for potential conversion of the signal voltage level of the drive signal output from each upper arm drive signal circuit to the signal voltage level required for operating the corresponding power semiconductor element (which is applied to the gate electrode). If consideration is given to the fact that the power modules PM1 and PM2 are electrically connected to the 42 v system power source and that the signal voltage level of the drive signals of the power semiconductor elements at the lower arm side that is grounded at the direct negative electrode (ground side), the signal voltage level of the drive signals of the power semiconductor elements at the upper arm side will be in the range of 0-12 v, the signal voltage level of the drive signals of the power semiconductor elements at the upper arm side will be in the range of 42-54 v. For this reason, the level shifting circuit 45 shifts (increases) the drive signal having a signal voltage level of 0-12 v by 42 v and drive signal having signal voltage level of 42-54 v are output.

The drive signals output from the level shifting circuit 45 are input to the soft gate drive circuit 43. The soft gate drive circuit 43 is a soft switching circuit which softens the current which the power semiconductor elements pass by softening the changes in the voltage of the drive signal input to the gate electrode of the power semiconductor elements and by softly turning on the power semiconductor elements. The drive signal whose voltage is controlled by the soft gate drive circuit 43 is applied to the gate electrode of the corresponding upper arm side power semiconductor element as the final drive signal.

The drive signals output from the control logic circuit 35 are input to the soft gate drive circuit 46 at the lower arm drive circuit for each phase. As described in the foregoing, since the signal voltage level for the drive signals of the power semiconductor elements at the lower arm side is 0-12 v at the lower arm drive circuit, the drive signals having a signal voltage level of 0-12 v that are output from the control logic circuit 35 are directly input to the soft gate drive circuit 46. The soft gate drive circuit 46 operates in the same manner as the above-described soft gate drive circuit 43. The drive signal whose voltage is controlled by the soft gate drive circuit 46 is applied to the gate electrode of the corresponding lower arm side power semiconductor element as the final drive signal.

The circuits for protecting the power semiconductor elements are the excess current protective circuit 44 provided so as to correspond to the upper arm drive circuits for each phase, the excess current protective circuit 47 provided so as to correspond to the lower arm drive circuits for each phase, and the protective circuit 42 that includes protective functions other than excess current protection such as excess voltage and excess temperature protection.

The u phase (v phase, w phase) excess current protection circuit 44 detects whether the current flowing in the power semiconductor elements MU1, MU3 (MV1, MV3, MW1, MW3) at the upper arm side for the u phase (v phase, w phase) is excess current, based on the voltage output from the sensor circuit 28, and the detection results are output as excess current flag signals. The excess current flag signals output from the excess current protection circuit 44 are input to the control logic circuit 35 via the level shifting circuit 45. The level shifting circuit 45 lowers (reduces) the signal voltage level of the excess current flag signal output from the excess current protection circuit 44, which is the opposite of what is done for the drive signals described above.

The u phase (v phase, w phase) excess current protection circuit 47 detects whether the current flowing in the power semiconductor elements MU2 and MU4 (MV2, MV4, MW2, MW4) at the lower arm side for the u phase (v phase, w phase) is excess current, based on the voltage output from the sensor circuit 30, and the detection results are output as excess current flag signals. The excess current flag signals output from the excess current protection circuit 47, are input directly to the control logic circuit 35.

In the case where the signal level of the excess current flag signal that is output from the excess current protection circuits 44 and 47 is a high level (the detection results indicate that there is excess current), the control logic circuit 35 interrupts the drive signal for the corresponding power semiconductor element or the drive signals for all the power semiconductor elements so that the operation of the corresponding power semiconductor element or the operation of all the power semiconductor elements is stopped and damage of the corresponding power semiconductor element or damage of all the power semiconductor elements is prevented. That is to say, the control logic circuit 35 performs interlocking.

The excess current flag signals output from the excess current protection circuits 44 and 47 are input to the motor control unit MCU via the interface circuit 24 from the control logic circuit 35. As a result, monitoring of abnormality of the inverter unit INV due to excess current becomes possible at the motor control unit MCU. Also, monitoring information can be transmitted from the motor control unit MCU to the engine control unit ECU and the like and vehicle control at the time of interlocking of the inverter unit INV and the like becomes possible. The interlock is released by a release signal from the motor control unit MCU. Alternatively, the interlock may be released after a fixed time has elapsed.

The protective circuit 42 has a plurality of protection functions such as temperature protection, excess voltage protection, abnormal voltage protection and the like. Temperature protection is a function for detecting whether the temperature at the power modules PM1 and PM2 is too high based on the temperature detection signal detected and output by the temperature sensor provided at the power modules PM1 and PM2. Abnormal voltage protection is a function for detecting the voltage applied to the drive circuit 25 and the interface circuit 24 from the insulating power source 32 and detecting whether the detected voltage is abnormal voltage. Excess voltage protection is a function for detecting the DC voltage applied to the power modules PM1 and PM2 and detecting whether the detected DC voltage is excess voltage. The detection results of the protective circuit 368 are output to the control logic circuit 35 as excess temperature flag signals, excess voltage signals, and abnormal voltage flag signals.

In the case where the signal level is high (the detection results indicate that there is excess temperature, excess voltage or abnormal voltage) for any one of the excess temperature flag signal, the excess voltage signal flag signal and the abnormal voltage signal output from the protective circuit 42, the control logic circuit 35 interrupts the drive signals for all the power semiconductor elements so that the operation of all the power semiconductor elements is stopped and damage of all the power semiconductor elements is prevented. That is to say, the control logic circuit 35 performs interlocking.

The excess temperature flag signal, the excess voltage signal flag signal, and the abnormal voltage signal output from the protection circuits 42 are input to the motor control unit MCU via the interface circuit 24 from the control logic circuit 35 in the same manner as the excess current flag signals. As a result, monitoring of abnormality of the inverter unit INV due to excess temperature, excess voltage, or abnormal voltage becomes possible at the motor control unit MCU. Also, monitoring information can be transmitted from the motor control unit MCU to the engine control unit ECU and the like and vehicle control at the time of interlocking of the inverter unit INV and the like becomes possible. The interlock is released by a release signal from the motor control unit MCU. Alternatively, the interlock may be released after a fixed time has elapsed.

It is to be noted that in this embodiment, in the case where there is abnormality at any one of the power modules PM1 and PM2, not only the operation of the power semiconductor elements for that power modules stopped, but rather that of the power semiconductor elements for both are stopped.

The circuit configuration for the interface circuit 24 will be described next.

The interface circuit 24 is the signal transmission circuit that is between the motor control unit MCU and the drive circuit 25 and the control signals VPu*-VNw* that are output to the drive circuit unit DU1 from the motor control unit MCU are transmitted to the drive control circuit 25 which has a different reference portion from that of the motor control unit MCU as the drive signals VPu-VNw.

Figure 7:
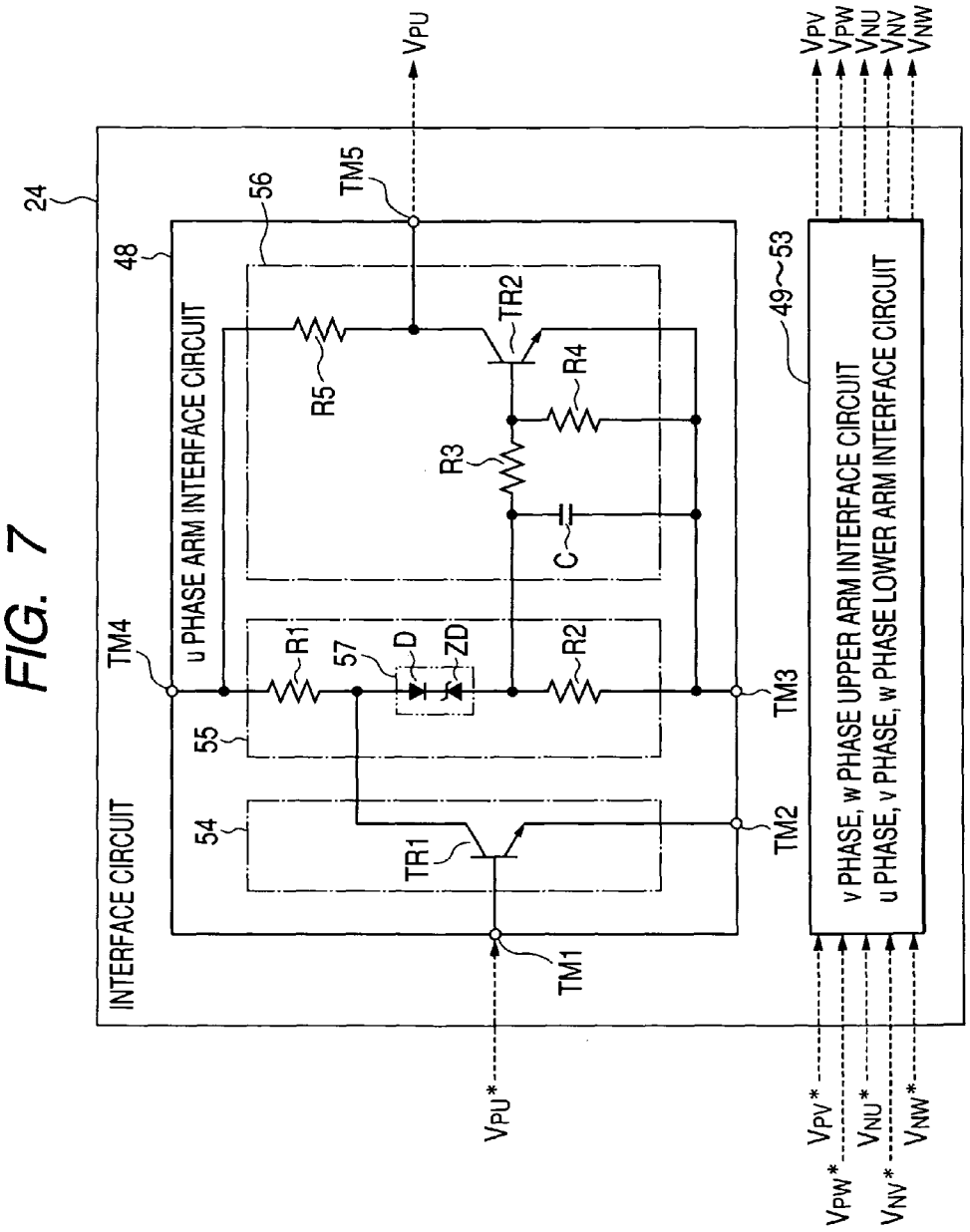
FIG. 7 is block diagram showing the circuit configuration of the interface circuit of FIG. 4.
Figure 8:
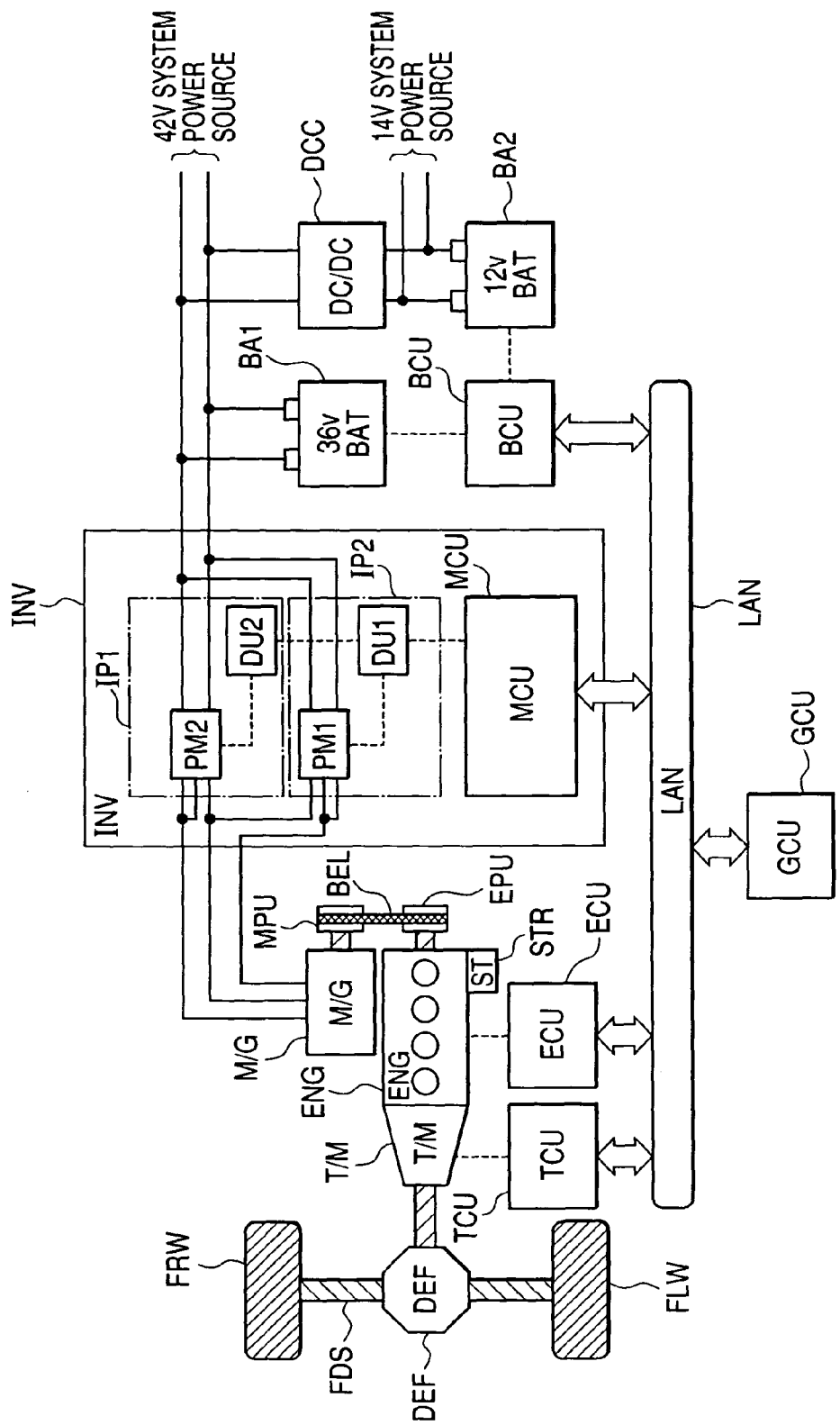
FIG. 8 is a block diagram showing the structure of the drive system of the hybrid automobile in which the on-vehicle inverter unit of FIG. 1 is applied.

As shown in FIG. 7, the interface circuit 24 has six circuits corresponding to the control signals VPu*-VNw* output from the motor control unit MCU (corresponding to the one of the upper and lower arms which are the two arms for each phase). In addition, the interface circuit 24 has a circuit (not shown) for transmitting protection signals such as the abnormality flag signals output from the drive circuit 25 between the motor control unit MCU and the drive circuit 25. The interface circuit 24 comprises a plurality of circuit elements such as transistors and diodes.

The control signal VPu* (VPv*, VPw*) is input to the u phase upper arm interface circuit 48 (v phase upper arm interface circuit 49, w phase upper arm interface circuit 50). The control signal VNu* (VNv*, VNw*) is input to the u phase lower arm interface circuit 51 (v phase lower arm interface circuit 52, w phase upper arm interface circuit 53). The circuit configuration for each of the arm interface circuits is the same. The u phase upper arm interface circuit 48 is described in the following as a representative example.

The u phase upper arm interface circuit 48 comprises the power source switching section 54, the noise absorption section 55 and the signal correction section 56.

The power source switching section 54 is a switching circuit for receiving the control signal VPu* output from the motor control unit MCU and operating the switching circuit, and is formed from an npn transistor TR1 which is a switching element. The transistor TR1 is electrically connected to different power source systems such that it can span different power source systems. The base electrode for the transistor TR1 is electrically connected to the terminal TM1. The terminal TM1 is electrically connected to the motor control unit MCU and receives control signal VPu* from the motor control unit MCU. It is to be noted that the voltage level of the control signal VPu* may, for example, be 5 v for the high level and 0 v for the low level. The voltage level for the other control signals is the same as the voltage level for the control signal VPu*. The collector electrode of the transistor TR1 is electrically connected to a noise absorption section 55 which is electrically connected to the operation power source of the interface circuit 24. The emitter electrode of the transistor TR1 is electrically connected to the terminal TM2. The terminal TM2 is electrically connected to the lower potential side (ground side) of the operation source in the motor control unit MCU.

The noise absorption section 55 is electrically connected to the resistor R1, the constant voltage dead zone generation section 55, and the resistor R2 in that order and comprises a serial circuit that is electrically connected serially. The noise absorption section 55 electrically absorbs the electrical effect generated by the abovementioned noise voltage and the signal corresponding to the voltage level of the operation light source of the interface circuit 24 is generated based on the switching operation of the light source switching section 54. One side of the serial circuit (the resistor R1 end side which is the opposite side to the connection end of constant voltage dead zone generation section 55) is electrically connected to the terminal TM4. The terminal TM4 is an electrical terminal and is electrically connected to the high potential side (positive pole) of the operation power source for the interface circuit 24. The other end of the serial circuit (the resistor R2 end which is the opposite side to the connection end of constant voltage dead zone generation section 57) is electrically connected to the terminal TM3. The terminal TM3 is electrically connected to the low potential side (negative pole and ground side) of the DC side of the power module PM1.

The resistor R1 comprises a low signal generation section. The resistor R2 comprises a high signal generation section. The constant voltage dead zone generation section 55 comprises a serial circuit in which the diode D and the Zener diode ZD are electrically and serially connected. When the transistor TR1 is on, it is affected by the noise voltage and the current flows to the high signal generation section and thus high level signal generation is prevented. The cathodes of the diode D and Zener diode ZD are electrically and serially connected to each other. The anode of the diode D is electrically connected to the resistor R1. The anode of the Zener diode ZD is electrically connected to the resistor R2.

When the switching operation of the power semiconductor elements of the power modules PM1 and PM2 is performed (when it is turned on), the noise voltage is a voltage generated to the parasitic inductance of the circuits of the power modules PM1 and PM2, and is a negative voltage which is expressed by the product of the parasitic inductance and the time changes for the current flowing through the parasitic inductance. When the noise voltage is generated, potential difference occurs between the terminals TM2 and TM3 and the potential of the terminal TM2 (the ground potential of the motor control unit MCU) is increased to be higher than the potential of the terminal TM3 (the ground potential of the power modules PM1 and PM2) by the amount of the noise voltage. For this reason, in the circuit in which the low signal generation section and the high signal generation section are electrically interconnected in serial, the current flows to the high signal generation section and high level signals are generated, and the high level drive signals which should be output from the interface circuit 24 become low level drive signals.

However, in this embodiment, even if there is potential difference in the two ground potentials due to the effects of the noise voltage, the current never flows to the high signal generation section due to the operation of the constant voltage dead zone generation section 55, and thus drive signals having the same signal level as the control signals input to the interface circuit 24 are transmitted from the interface circuit 24 to the drive circuit 25. As a result, in this embodiment, signal transmission is carried out between circuits with different reference potentials (circuits with different power source systems) without using optical elements such as a photo-coupler and the like.

The signal correction section 56 is a voltage increasing circuit for changing the voltage level of signals output from the noise absorption section 55 such that they become the drive signals for turning the power semiconductor elements on or off according to the signals output from the noise absorption section 55, and comprises the resistors R3-R5, the condenser C and the transistor TR2. The condenser C forms a filter circuit and the high frequency portion is removed and only the DC signal component is supplied to the base electrode of the transistor TR2 such that the transistor TR2 does not operate in error due to the noise signals that have been superimposed on the voltage at both ends of the resistor R2 due to the switching operation of the transistor TR1.

The resistors R3 and R4 comprise a resistor voltage circuit and when the voltage at both ends of the resistor R2 does not reach the high level/low level required for turning the transistor TR2 on/off, it is converted to the high level/low level voltage required for turning the transistor TR2 on/off. The resistor R5 is a pull-up resistor, which makes the signal voltage out from the terminal TM5, output terminal stable.

The signal voltage level of the drive signal output from the signal correction section 56 is 0 v when the transistor TR2 is on and when the transistor TR2 is off, the power source voltage of the signal correction section 56 is 12 v for example. On the other hand, the voltage for turning on the power semiconductor elements of the power modules PM1 and PM2 is 3 v. Accordingly, the signal correction section 56 converts the signal voltage level of the drive signal output from the interface circuit 24 to a signal voltage level (high level: 12 v/low level: 0 v) that is higher than the signal voltage level (high level: 5 v/low level: 0 v) of the signals input to the base electrode of the transistor TR2.

When the signal level of the control signal output from the motor control unit MCU is low and the transistor TR1 is off, current flows to the Zener diode ZD and the resistor R2, and the transistor TR2 comes on. Thus, the signal voltage level of the drive signal output from the signal correction section 56 is low. At this time, the collector electrode of the transistor TR1 is in an open state and thus even if the noise voltage causes potential difference between the terminal TM2 and the terminal TM3, this does not affect the sending and receiving of signals.

When the signal level of the control signal output from the motor control unit MCU is high and the transistor TR1 is on, current does not flows to the Zener diode ZD and the transistor TR2 comes off. Thus the signal voltage level of the drive signal output from the signal correction section 56 is high. At this time, the potential of the collector electrode of the transistor TR1 is almost equal to the potential of the terminal TM2, and even if the potential of the terminal TM2 becomes higher than the potential of the terminal TM3 due to the noise voltage, the transistor TR2 never comes on in error provided that the potential is less than the Zener voltage of the Zener diode ZD.

If the potential of the terminal TM2 becomes lower than the potential of the terminal TM3 due to the noise voltage, the current value of the transistor TR1 becomes large. However, this does not affect the operation of the transistor TR2 provided that the current value is within a range which does not exceed the maximum current value of the transistor TR1 and the reverse withstand voltage of the diode D.

In this embodiment, the signal transmission between the motor control unit MCU and the drive circuit 25 is performed using an interface circuit 24 that is equipped with a constant voltage dead zone generation section 57, and thus even if variation in the potential difference occurs between the terminal TM2 and the terminal TM3 due to the noise voltage generated by the parasitic inductance, the control signals output from the motor control unit MCU are transmitted to the drive circuit 25 as drive signals without being affected by the variation. Accordingly in this embodiment, signal transmission can be carried out between circuits with different reference potentials without using optical elements such as a photo-coupler and the like, thus achieving cost reduction and attaining high control reliability.

The motor control unit MCU will be described next.

The motor control unit MCU is a computation device formed from a microcomputer, and a plurality of input signals is input therein. Control signals VPu*-VNw* for operating the power semiconductor elements of the power modules PM1 and PM2 are output to the drive circuit unit DU1. Torque command value τ, rotation frequency command value N, detection signals Siu-Siw, and detection signals Sθ are input as input signals. The torque command value τ and the rotation frequency command value N are output from the general control unit GCU in accordance with the operating mode of the vehicle. The detection signals Siu-Siw are output from the current sensors Ciu-Ciw. The detection signals Sθ are output from a magnetic pole position sensor MPC.

The current sensors Ciu-Ciw are for detecting the u phase-w phase currents iu-iw that are supplied from the inverter unit INV to the stator winding of the motor generator M/G and comprise a shunt resistor and a current transformer (CT) and the like. The magnetic pole position sensor MPC is for detecting the magnetic pole position θ of the motor generator M/G rotor MRO and comprises a resolver, an encoder, a hole element, a hole IC and the like.

The motor control unit MCU computes voltage control values Vu-Vw based on the input signals and the computed voltage control values Vu-Vw are output to the drive circuit unit DU1 as control signals (PWM signals (pulse width modulation signals)) for operating the power semiconductor elements for one of the two arms for each phase.

Next, the actual structure of the inverter unit INV of this embodiment which is applied to the foregoing circuit configuration will be described based on FIGS. 1 and 2.

The inverter unit INV is formed by storing the intelligent power modules IP1 and IP2 and the motor control unit MCU in an inverter case (not shown) made of aluminum. The inverter case is a closed container and it dissipates noise from the inside of the inverter unit INV to the outside and shields noise transmission from the outside to the inside of the inverter unit INV.

A heat dissipating member (not shown) is disposed at the bottom part of the interior of the inverter case. The heat dissipating member performs cooling using a cool agent (a cool liquid such as water or antifreeze, or cold air) supplied from the outside to the bottom part of the interior of the inverter case, and at the surface of the other side, a plurality of fans that come in contact with the cooling agent are formed. The intelligent power modules IP1 and IP2 are placed side by side and fixed on the flat surface of the other side of the heat dissipating member (the side opposite to the side where the fans are formed). A control circuit board 21 which forms the motor control unit MCU is disposed and fixed above the intelligent power modules IP1 and IP2. Input and output power cables (not shown) extend from the inverter case. The input power cables electrically connect the positive and negative electrodes of the high voltage battery BA1 with the input and output ends of the inverter unit INV. The output power cables electrically connect the output end of the inverter unit INV and the stator winding of the motor generator M/G.

It is to be noted that in this embodiment, the position of the control circuit base 21 is shifted to the opposite side of the intelligent power module IP2 of the intelligent power module IP1 in order to make the configuration of the intelligent power modules IP1 and IP2 located under the control circuit base 21 easily visible.

The intelligent power module IP1 (IP2) is formed from one assembly and the drive circuit board 5 (6) of the drive circuit unit DU1 (DU2) is mounted on the flat surface of the outside of the upper cover of the module case 1 (2) of the power module PM1 (PM2). The bottom of the module case 1 (2) is formed of the flat module base 3 (4). The module base 3 (4) is a heat conducting member formed from copper or an Al—SiC alloy and is fixed onto the heat dissipating member by a fixing means such as a bolt or the like such that the bottom surface thereof contacts the surface of the heat dissipating member.

The module case 1 (2) has two sets of opposing side walls. Output terminals (AC terminals) 15-17 (18-20) protrude so as to extend from one direction of one set of the side walls to the outside. The output terminals 15-17 (18-20) are flat narrow conductive members whose projection direction is the long side direction and the direction crossing the projection direction is the short direction, and the output terminals 15-17 (18-20) extend in parallel to the module base 3 (4).

The input terminal (DC terminal) 10 (14) protrudes from another side wall so as to extend to the outside. The input terminal (DC terminal) 10 (14) is formed from a laminate in which wide flat conductive members are layered. In the laminate, the projection direction is the short direction and the direction crossing the projection direction is the long direction (the direction in which the intelligent power modules IP1 and IP2 are mounted in parallel (referred to as parallel mounting direction hereinafter)). The input terminal (DC terminal) 10 (14) extends serial to the module base 3 (4). The laminate of the input terminal (DC terminal) 10 (14) is formed by layering the positive terminal 7 (11), the insulating member 9 (13), and the negative terminal 8 (12) respectively in that order from the lower layer side to the upper layer side. The insulating member 9 (13) electrically insulates the positive terminal 7(11) and the negative terminal 8 (12). The length of the positive terminal 7 (11) in the projection direction is greater than that for the negative terminal 8 (12).

It is to be noted that the positions of the positive terminal 7(11) and the negative terminal 8 (12) in the laminate may be reversed such that the positive terminal 7(11) is the upper layer of the input terminal 10 (14) and the negative terminal 8 (12) is the lower layer.

A condenser terminal 96 is fixed to the input terminal 10 (14) using screws. The condenser terminal 96 is formed from a laminate in which wide flat conductive members are layered. In the laminate, the projection direction of the input terminal 10 (14) is the short direction and the long direction of the input terminal 10 (14) is the long direction (parallel mounting direction hereinafter). The condenser terminal 96 extends parallel to the mounting surface of the intelligent power modules IP1 and IP2. The laminate of the condenser terminal 96 is formed by layering the positive terminal 99, the insulating member 98, and the negative terminal 97 respectively in that order from the lower layer side to the upper layer side. The insulating member 98 electrically insulates the positive terminal 99 and the negative terminal 97. The length by which the negative terminal 97 extends in the at the input terminal 10 (14) side is greater than that for the positive terminal 99.

It is to be noted that if the layer position of the positive terminal 7(11) and the negative terminal 8 (12) in the input terminals 10 and 14 is reversed, the layer position of the positive terminal 99 and the negative terminal 97 of the condenser terminal 96 is also reversed.

The negative terminal 97 is layered on the negative terminals 8 and 12 such that the lower surface thereof contacts the lower surface of the negative terminals 8 and 12 and is fixed thereto. As a result, the negative terminal 97 and the negative terminals 8 and 12 are electrically connected. The positive terminal 99 is layered on the positive terminals 7 and 11 such that the lower surface thereof contacts the upper surface of the positive terminals 7 and 11 and is fixed thereto. As a result, the positive terminal 99 and the positive terminals 7 and 11 are electrically connected. Two smooth electrolytic condensers SEC are disposed at the lower surface side of the positive terminal 99. The smooth electrolytic condensers SEC are mounted in parallel in the same parallel direction as the IPM, and the positive terminal and the negative terminal are fixed to the condenser terminal 96 using screws. The positive terminal of the smooth electrolytic condenser SEC is electrically connected to the positive terminal 99 of the condenser terminal 96 using screws. The negative terminal of the smooth electrolytic condenser SEC is electrically connected to the negative terminal 97 of the condenser terminal 96 using screws.

A high voltage battery BA1 is electrically connected to one end of the long side direction (the parallel mounting direction of the smooth electrode condenser SEC) of the condenser terminal 96 via a power cable. The positive pole side of the high voltage battery BA1 is electrically connected to the positive terminal 99 via a power cable. The negative pole side of the high voltage battery BA1 is electrically connected to the negative terminal 97 via a power cable.

The abovementioned plurality of terminals (not shown) extend upward from the upper surface of the two side walls of module cases 1 and 2. The terminal that projects from the module cases 1 and 2 is a control terminal that is connected to the gate electrode of the power semiconductor elements and is bonded by a bonding member such as a solder or the like to the wire conductor that is inserted through the through-hole provided in the drive circuit board. As a result, the terminal that protrudes from the module cases 1 and 2 is electrically connected to the wire conductor of the drive circuit boards 5 and 6. The drive circuit boards 5 and 6 are formed of a print boards which have a plurality of wire conductors The middle section of the drive circuit board 5 has a drive circuit 25. As described in the foregoing, the drive circuit 25 comprises one IC chip in which a plurality of leads are led from the mold member. The leads of the IC chips comprising the drive circuit 25 are bonded by a bonding member such as a solder or the like to the wire conductor of the drive circuit board 5. As a result, the IC chips comprising the drive circuit 25 are electrically connected to wire conductor of the drive circuit board 5. Both ends of the drive circuit board 5 located in the projection direction of the output terminals 15-17 and the input terminal 10 have a sensor circuit 28 and a snubber circuit 29. The circuit elements comprising the sensor 28 and the snubber circuit 29 are bonded by a bonding material such as a solder or the like to the wire conductor of the drive circuit board 5. The circuit elements comprising the sensor 28 and the snubber circuit 29 are electrically connected to the wire conductor of the drive circuit board 5.

One side in the parallel mounting direction of the drive circuit board 5 (the direction opposite to the intelligent power module IP2 side) has an interface circuit 24 and a connector 23. The interface circuit 24 and the connector 23 respectively are disposed at one side end of the parallel mounting direction of the drive circuit board 5 such that the interface circuit 24 is adjacent to the drive circuit 25, and the connector 23 is adjacent to the interface circuit 24.

As described in the foregoing, the interface circuit 24 comprises six IC chips in which a plurality of leads are led from the mold material. It is to be noted that the interface circuit 24 includes a plurality of IC chips (not shown) in addition to these six IC chips. The leads of the IC chips comprising the interface circuit 24 are bonded by a bonding member such as a solder or the like to the wire conductor of the drive circuit board 5. As a result, the IC chips comprising the interface circuit 24 are electrically connected to the wire conductor of the drive circuit board 5.

The connector 23 electrically connects the signal wire between the control circuit board 21 and the drive circuit board 5 with the wire conductor of the drive circuit board 5. The connector 23 is provided on the drive circuit board 5 and is formed from a female connector electrically connected to the wire conductor of the drive circuit board 5 and from a male connector which is electrically connected to the signal wires between the control circuit board 21 and the drive circuit board 5 and inserted into the female connector.

The other side end in the parallel mounting direction of the drive circuit board 5 (the intelligent power module IP2 end) has a connector 26. The connector 26 electrically connects the signal wire between the drive circuit board 5 and the drive circuit board 6 with the wire conductor of the drive circuit board 5. The connector 26 is provided on the drive circuit board 5 and is formed from a female connector electrically connected to the wire conductor of the drive circuit board 5 and from a male connector which is electrically connected to the signal wires between the drive circuit board 5 the drive circuit board 6 and inserted into the female connector.

Both ends of the drive circuit board 6 located in the projection direction of the output terminals 18-20 and the input terminal 14 have a sensor circuit 30 and a snubber circuit 31. The circuit elements comprising the sensor 30 and the snubber circuit 31 are bonded by a bonding material such as a solder or the like to the wire conductor of the drive circuit board 6. Thus the circuit elements comprising the sensor 30 and the snubber circuit 31 are electrically connected to the wire conductor of the drive circuit board 6.

One side end in the parallel mounting direction of the drive circuit board 6 (the intelligent power module Ipi end) has a connector 27. The connector 27 electrically connects the signal wire between the drive circuit board 5 and the drive circuit board 6 with the wire conductor of the drive circuit board 6.

The connector 27 is provided on the drive circuit board 6 and is formed from a female connector electrically connected to the wire conductor of the drive circuit board 6 and from a male connector which is electrically connected to the signal wires between the drive circuit board 5 and the drive circuit board 6 and inserted into the female connector.

The middle section of the control circuit board 21 has the IC chips comprising the microcomputer (not shown) which was described above. The control circuit board 21 is formed from a print board on which a plurality of wire conductors are provided. Like the IC chip described above, the microchip is configured such that a plurality of leads are led from the mold material. The leads of the microchip are bonded by a bonding material such as a solder or the like to the wire conductor of the control circuit board 21. As a result, the microchip is electrically connected to the wire conductor of the control circuit board 21.

One side end in the parallel mounting direction of the control circuit board 21 (the intelligent power module IP1 end) has a connector 22. The connector 22 electrically connects the signal wire between the control circuit board 21 and the drive circuit board 5 with the wire conductor of the control circuit board 21. The connector 22 is provided on the control circuit board 21 and is formed from a female connector electrically connected to the wire conductor of the control circuit board 21 and from a male connector which is electrically connected to the signal wires between the control circuit board 21 and the drive circuit board 5 and inserted into the female connector. In the case where the control circuit board 21 is disposed above the intelligent power modules IP1 and IP2, the connector 27 is provided at the end of the intelligent power modules IP1 of the control circuit board 21 in the same manner.

In this embodiment, the interface circuit 24 and the drive circuit 25 are provided only at the power module PM1 and thus the configuration of the drive circuit unit DU2 becomes simple and the cost of the inverter unit INV is reduced.

Furthermore in this embodiment, when the intelligent power module IP2 is subsequently added to the intelligent power modules IP1 with increase in current, even if there are two power modules PM1, there is no need to increase the number of drive circuits 25 and interface circuits 24 in accordance with the number of power modules. Thus in this embodiment, the number of intelligent power modules can be increased at a low cost.

It is to be noted that in this embodiment, if the signal wire path from the drive circuit to the power module side is configured such that switching on the path is possible, when the number of intelligent power modules is increased, the signal wire path from the drive circuit to the power module side can be easily switched without replacing the drive circuit board.

An example of a method for switching the signal wire path may be providing a switching circuit comprising a semiconductor element is provided on the signal wire path, and this is switched when an additional intelligent power module is installed. Another example of a method for switching the signal wire path may be connecting the drive circuit side signal wire path with the power module side signal wire path using a wire material, and then changing the connection of the wire material at the time of mounting an additional intelligent power module. By employing this type of configuration, in this embodiment, additional intelligent power modules can be easily provided without replacing the drive circuit board.

In this embodiment, the positive terminal 7 (11) and the negative terminal 8 (12) of the DC terminal 10 (14) have a layered configuration and thus the current flowing in the positive terminal 7 (11) and the current flowing in the negative terminal 8 (12) are close and also can flow in opposite directions. As a result, in this embodiment, the parasitic inductance of the input terminal 10 (14) due magnetic interference of two magnetic fluxes occurring in the current flowing in opposite directions is decreased and thus surge voltage due to parasitic inductance is kept low. The condenser terminal 96 has the same configuration and thus the same effects can be obtained.

Next, the inner configuration of the power modules PM1 and PM2 will be described.

The input terminal 10 (14) has a comb-like configuration and comprises an above-described wide flat portion (the comb body portion) and three narrow flat portions (the comb teeth portion) which extend from the comb body portion to the middle of the module case 1(2). Both the narrow flat portion and the wide flat portion have the same layer configuration. The narrow flat portion is crimped such that the height is lower than that of the wide flat portion, and it passes through the inner wall surface of the side wall of the module case 1(2), extends to the middle of the module case 1(2) and is mounted on the surface of the module case 3(4) via the insulating members 71, 73 and 75. The three narrow flat portions are arranged in parallel at equal intervals. The positive terminal 7 (11) which is positioned at the lower layer side in the narrow flat portion extends to the middle of the module case 1 (2) at a longer distance than the negative terminal 8 (12) which is positioned at the upper layer side. The configuration is such because it makes it possible to connect the aforementioned wire lines with the positive terminal 7 (11) which is positioned at the lower layer side. The long side direction of the narrow flat portion is the direction for extension to the inside of the module case 1 (2), and the short side direction is the parallel mounting direction.

The output terminals 15-17 (18-20) comprise a portion that extends to the outside of the module case 1 (2) (simply referred to as outer extension portion hereinafter) and a portion that extends inside the module case 1 (2) (simply referred to as inner extension portion hereinafter) from the outer portion. The inner extension portion of the output terminals 15-17 (18-20) is crimped such that the height is lower than that of the outer extension portion, and it passes through the inner wall surface of the side wall of the module case 1(2), extends into the module case 1(2) and is mounted on the surface of the module case 3(4) via the insulating members 70, 72 and 74. The long side direction of the inner extension portion of the output terminals 15-17 (18-20) is the direction for extension into the module case 1 (2), and the short side direction is the parallel mounting direction. The output terminals 15-17 (18-20) are arranged in parallel with equal space between them in the parallel mounting direction.

The inner extension portion of the output terminals 15-17 (18-20) and the three narrow flat portions of the input terminal 10 (14) are disposed on the on the module base 3 (4) such that those comprising opposing arms oppose each other diagonally.

A plurality of insulating boards is disposed on the upper surface of the module base 3 (4). Of these, the insulating board 58 (60, 62) is mounted at the portion that opposes the long side direction of the narrow flat portion at one side of the parallel mounting directions (middle of parallel mounting direction and other side of parallel mounting direction) and which is adjacent to the parallel mounting direction of the inner extension portion of the output terminals 15 (18), 16(19), 17(20) from among three narrow flat portions of the input terminal 10 (14). On the other hand, the insulating board 59 (61, 63) is mounted at the portion adjacent to one parallel mounting direction of the narrow flat portion that is disposed at one side of the parallel mounting directions (middle of parallel mounting direction and other side of parallel mounting direction) which opposes the inner extension portion of the output terminals 15 (18), 16(19), 17(20) in the long-side direction from among three narrow flat portions of the input terminal 10 (14). The insulating board is a flat insulating member made from ceramics (aluminum nitride).

The base conductor 64 (66, 68) is provided on the upper surface of the insulating board 58 (60, 62). Base conductors (not shown) are also provided on the lower surface of the insulating board 58 (60, 62). The base conductor 64 (66, 68) and base conductors at the lower surface side of the insulating board 58 (60, 62) are flat conductive members made of copper and formed by subjecting the upper and lower surfaces of the insulating board 58 (60, 62) to metalizing processing. Bare chips forming power semiconductor element MU1 ((MV3) (MU3 (MW1), (MV1 (MW3)) are mounted on the upper surface of the base conductor 64 (66, 68) by bonding using a wax material, and they are electrically connected to base conductor 64 (66, 68).

The base conductor 65 (67, 69) is provided on the upper surface of the insulating board 59 (61, 63). Base conductors (not shown) are also provided on the lower surface of the insulating board 59 (61, 63). The base conductor 65 (67, 69) and base conductors at the lower surface side of the insulating board 59 (61, 63) are flat conductive members made of copper and formed by subjecting the upper and lower surfaces of the insulating board 59 (61, 63) to metalizing processing. Bare chips comprising power semiconductor elements MU2 ((MV4) (MU4 (MW2), (MV2 (MW4)) are mounted on the upper surface of the base conductor 65 (67, 69) by bonding using a wax material, and they are electrically connected to base conductor 65 (67, 69).

The drain electrode side of the power semiconductor element MU1 ((MV3) (MU3 (MW1), (MV1 (MW3)) is bonded to the base conductor 64 (66, 68). In addition, the power semiconductor element MU2 ((MV4) (MU4 (MW2), (MV2 (MW4)) is bonded to the base conductor 65 (67, 69).

The insulating boards 58, 60 and 62 and the insulating boards 59, 61 and 63 have base conductors provided on the lower surfaces thereof and are mounted on the upper surfaces of the module bases 3 and 4 on which the base conductors are bonded using a wax material.

Of the three narrow flat portions of the input terminal 10 (14), wire line W12 (W20, W24) is bonded between the positive terminal 7 (11) of the narrow flat portion that is disposed at one parallel mounting direction side (middle of parallel mounting direction and other side of parallel mounting direction) the base conductor 64 (66, 68). As a result, the positive terminal 7 (11) of the input terminal 10 (14) and the drain electrode of the power semiconductor element MU1 ((MV3) (MU3 (MW1), (MV1 (MW3)) are electrically connected. Furthermore, wire line W10 (W17, W26) is bonded between the output terminals 15 (18), (16 (19), 17 (20)) and the source electrodes of the power semiconductor element MU1 ((MV3) (MU3 (MW1), (MV1 (MW3)). As a result, the source electrode of the power semiconductor element MU1 ((MV3) (MU3 (MW1), (MV1 (MW3)) and the output terminals 15 (18), (16 (19), 17 (20)) are electrically connected. The wire line is a conductive member made of aluminum.

Of the three narrow flat portions of the input terminal 10 (14), wire line W14 (W19, W22) is bonded between the negative terminal 8 (12) of the narrow flat portion that is disposed at one parallel mounting direction side (middle of parallel mounting direction and other side of parallel mounting direction) and the source electrode of the power semiconductor element MU2 ((MV4) (MU4 (MW2), (MV2 (MW4)). As a result, the source electrode of the power semiconductor element MU2 ((MV4) (MU4 (MW2), (MV2 (MW4)) and the negative terminal 8 (12) of the input terminal 10 (14) are electrically connected. Furthermore, wire line W11 (W15, W23) is bonded between the output terminals 15 (18), (16 (19), 17 (20)) and the base conductor 65 (67, 69). As a result, the drain electrode of the power semiconductor element MU2 ((MV4) (MU4 (MW2), (MV2 (MW4)) and the output terminals 15 (18), (16 (19), 17 (20)) are electrically connected. The wire line is a conductive member made of aluminum.

As described above, a plurality of terminals 76-81 protrude upwards from the upper surface of the side walls of the module cases 1 and 2. The terminals 76-81 are each formed from a plurality of terminals such as control terminals. The ends at the side opposite to the projection end of the terminals 76-81 are flat electrodes and are crimped at right angles from the projection end so as to be exposed at the middle of the module case 1 (2) and extend into the module case 1 (2).

Wire line W16 (W27, W25) is bonded between the gate electrode of the power semiconductor element MU1 ((MV3) (MU3 (MW1), (MV1 (MW3)) and the base conductor 64 (66, 68) and the like, and the electrode portion of the terminal 76 (78, 80). As a result, the gate electrode of the power semiconductor element MU1 ((MV3) (MU3 (MW1), (MV1 (MW3)) and the base conductor 64 (66, 68) and the like, and the electrode portion of the terminal 76 (78, 80) are electrically connected.

Wire line W13 (W18, W21) is bonded between the gate electrode of the power semiconductor element MU2 ((MV4) (MU4 (MW2), (MV2 (MW4)) and the base conductor 65 (67, 69) and the like, and the electrode portion of the terminal 77 (79, 81). As a result, the gate electrode of the power semiconductor element MU2 (MV4) ((MU4 (MW2), (MV2 (MW4)) and the base conductor 65 (67, 69) and the like are electrically connected with the terminal 77 (79, 81).

In this embodiment, the insulating boards 58, 60 and 62 and the narrow flat portion of the input terminal 10 (14), and the insulating boards 59, 61 and 63 and the output terminals 15-17 (18-20) are each disposed so as to alternate in the parallel mounting direction, such that the insulating boards 58-63 and the narrow flat portion of the input terminal 10 (14), and the output terminals 15-17 (18-20) are disposed so as to have a checker board pattern on the upper surface of the module base 3 (4). Thus, unneeded base conductors are never provided on the upper surface of insulating boards 58-63 and the input terminal 10 (14) and the output terminals 15-17 (18-20) and the power semiconductor elements MU1-MV2 (MV3-MV4) can be electrically connected by a wire line. As a result, in this embodiment, the wire line connection locations can be reduced and the mounting area on the power modules PM1 and PM2 can be decreased.

In addition, in this embodiment, due to the arrangement of the insulating boards 58-63 and the narrow flat portion of the input terminal 10 (14), and the output terminals 15-17 (18-20), a small looped current path is formed on the module base 3 (4). For example, the looped current path may be formed as follows at the U1 phase arm AU1: positive terminal 7 of one parallel mounting direction side narrow flat portion of the input terminal 10→wire line W12→base conductor 64→drain electrode of power semiconductor element MU1→source electrode of power semiconductor element MU1→wire line W10→output terminal 15→wire line W11→base conductor 65→drain electrode of power semiconductor element MU2→source electrode of power semiconductor element MU2→wire line W14→negative terminal 8 of one parallel mounting direction side narrow flat portion of the input terminal 10. As a result, in this embodiment, in the case where the current amount changes with time, the excess current which is opposite to the current which flows in the looped current path and whose flow direction is reversed can flow on the module base 3 (4), and parasitic inductance in the current path can be reduced by magnetic interference of magnetic flux caused by current flowing in the looped current path and magnetic flux caused by the excess current. Accordingly in this embodiment, surge voltage at the time of the switching operation of the power semiconductor element can be controlled.

Furthermore, in this embodiment, the looped current path can be made as small as possible and thus the parasitic inductance can be further reduced.

Also, in this embodiment, the wire direction of the wire lines can be made perpendicular and thus magnetic noise caused by current flowing in the wire line can be reduced.

Next, the second embodiment of this embodiment will be described based on FIG. 9.

Figure 9:
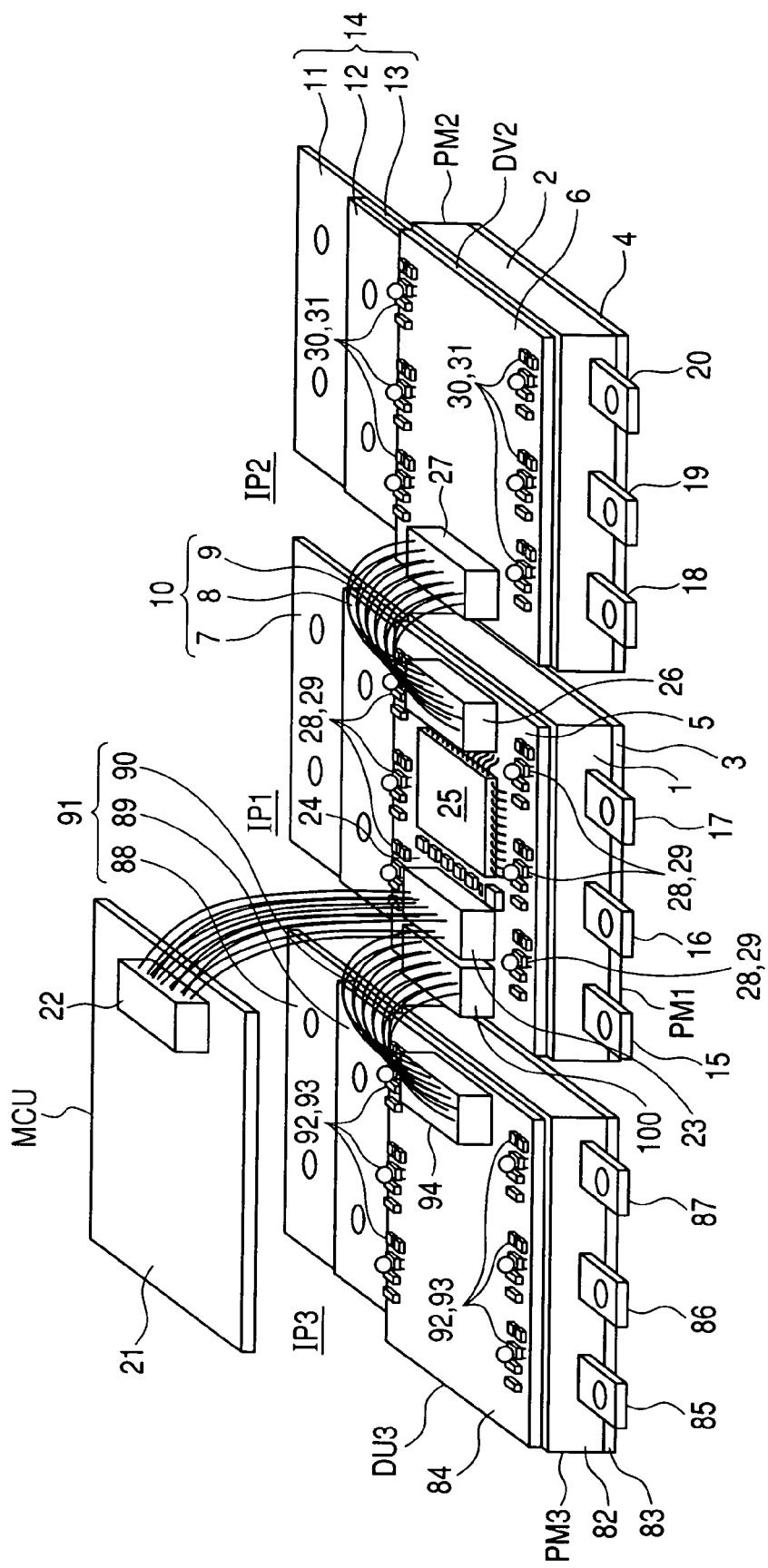
FIG. 9 is a perspective view showing the external structure of the on-vehicle inverter unit which is the second embodiment of this invention.

FIG. 9 shows the configuration of the vehicle inverter unit of this embodiment. This embodiment is an improved version of embodiment 1, and the inverter unit comprises three intelligent power modules.

Figure 2:
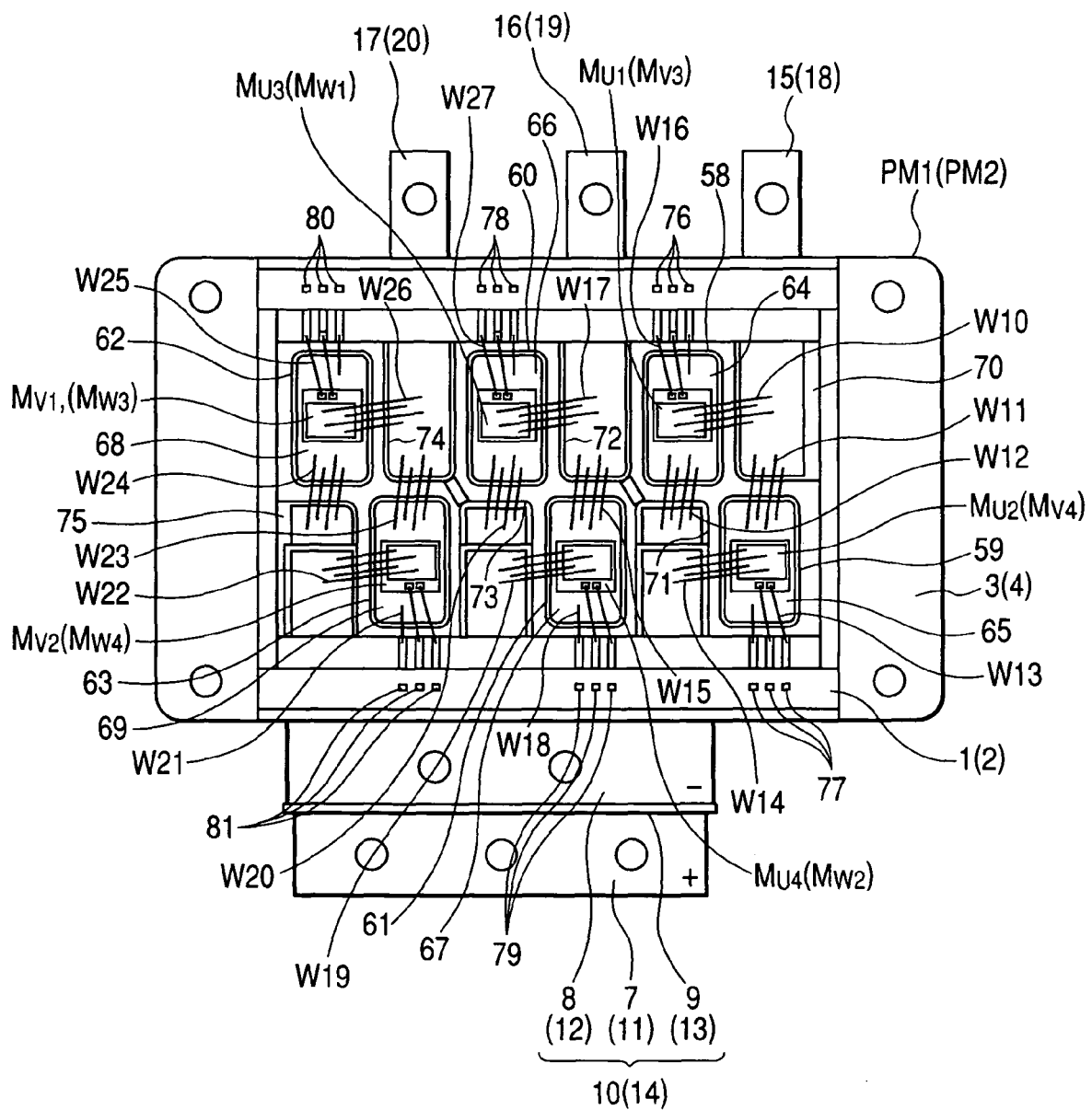
FIG. 2 is a plan view showing the mounting structure of the power module of FIG. 1.

In this embodiment, the intelligent power module IP3 is added to the structure of FIG. 1 and the connector 100 is added to the drive circuit board 5. As a result, in this embodiment, the main circuit comprises three arms for each phase. Accordingly in this embodiment, of the power modules PM1-PM3, the power module PM2, for example, forms the u phase main circuit, the power module PM1 forms the v phase main circuit and the power module PM3 forms the w phase main circuit.

In this embodiment, the drive signal corresponding to one upper and lower arm of the three arms for each phase are output to the drive circuit 25. After the drive signals which correspond to the u phase upper and lower arms are output to the drive circuit 25, the drive signals are transmitted from the drive circuit unit DU1 to the drive circuit unit DU2 and electrically branched into three signals and then supplied to the gate electrodes of the three upper arm side power semiconductor elements and to the gate electrodes of the three lower arm side power semiconductor elements respectively. The drive signals corresponding to the w phase upper and lower arms are output from the drive circuit 25 and then transmitted from the drive circuit unit DU1 to the drive circuit unit DU3, and then after being electrically branched into three signals, the drive signals are supplied to the gate electrodes of the three upper arm side power semiconductor elements and to the gate electrodes of the three lower arm side power semiconductor elements respectively. The drive signals corresponding to the v phase upper and lower arms are output from the drive circuit 25 and then after being electrically branched into three signals, the drive signals are supplied to the gate electrodes of the three upper arm side power semiconductor elements and to the gate electrodes of the three lower arm side power semiconductor elements respectively.

The intelligent power module IP3 comprises an input terminal 91 that is formed of a laminate including the positive terminal 88, the insulating member 90 and the negative terminal 89; a power module PM3 including output terminals 85-87, the module case 82 and the module base 83; and the drive circuit unit DU3 which has a sensor circuit 92, a snubber circuit 93 and a connector 94 on a drive circuit board 84. The configuration of the power module PM3 is the same as that of the power modules PM1 and PM2. The drive circuit unit DU3 has the same configuration as that of the drive circuit unit DU2 if connector 94 mounting position is excluded.

In the drive circuit unit DU3, unlike the drive circuit unit DU2, the connector 94 is provided at the other parallel mounting side portion (the intelligent power module IP1 side end) of the drive circuit board 84. The connector 94 electrically connects the signal wire between the drive circuit board 5 and the drive circuit board 84 with the wire conductor of the drive circuit board 84. The connector 94 is provided on the drive circuit board 84 and is formed of a female connector which is electrically connected to the wire conductor of the drive circuit board 84 and a male conductor which is electrically connected to the signal wires between the drive circuit board 5 and the drive circuit board 84 and inserted into the female connector.

The connector 100 is provided at one parallel mounting side end (the intelligent power module IP3 side end) of the drive circuit board 5 so as to be adjacent to one parallel mounting side (the intelligent power module IP3 side end) of the connector 23. The connector 100 electrically connects the signal wire between the drive circuit board 5 and the drive circuit board 84 with the wire conductor of the drive circuit board 5. The connector 100 is provided on the drive circuit board 5 and is formed of a female connector which is electrically connected to the wire conductor of the drive circuit board 5 and is electrically connected to the signal wires between the drive circuit board 5 and the drive circuit board 84 and inserted into the female connector.

The other structures are the same of that of the first embodiment and thus descriptions thereof are omitted.

In this embodiment, the inverter unit INV comprised three intelligent power modules and thus the amount of current that is allotted to each arm is less than in the first embodiment. As a result, in this embodiment, an inverter unit INV is provided in which even greater control of large currents is possible.

In this embodiment, because the amount of current that is allotted to each arm is less than in the first embodiment, there is less damage of the power semiconductor elements than in the first embodiment and thus the conversion efficiency of the inverter unit INV is improved.

Embodiment 3

The third embodiment of this invention will be described based on FIG. 10.

Figure 10:
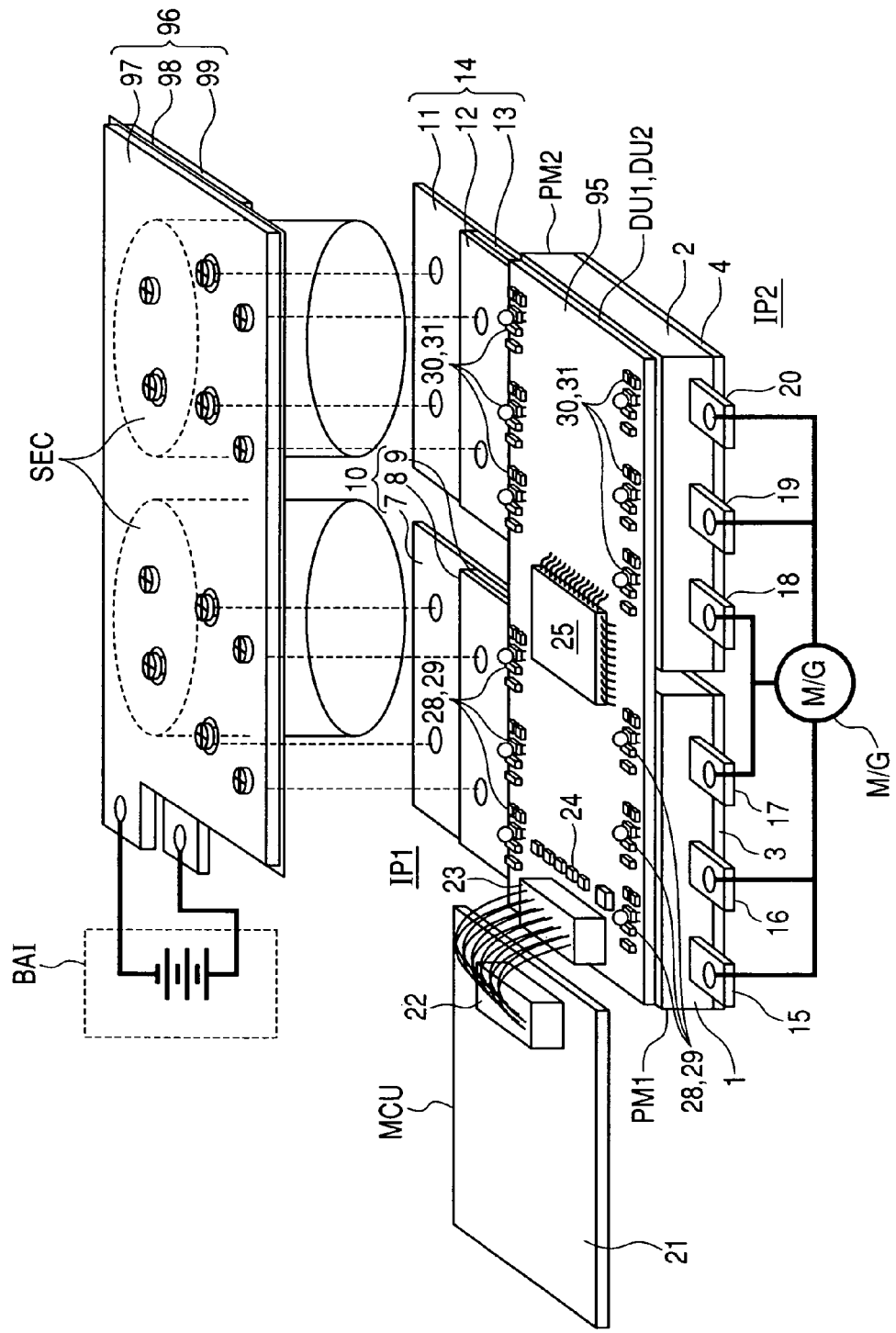
FIG. 10 is a perspective view showing the external structure of the on-vehicle inverter unit which is the third embodiment of this invention.

FIG. 10 shows the configuration of the inverter unit for a vehicle of this embodiment. This embodiment is an improved version of embodiment 1, and the drive circuit boards of drive circuit units DU1 and DU2 are shared.

In this embodiment, the drive circuit board of the drive circuit unit DU1 and the drive circuit board 6 of the drive circuit unit DU2 in FIG. 1 are combined in the center of the parallel mounting direction and the drive circuit units DU1 and DU2 are formed of a single drive circuit board 95. As a result, in this embodiment, the connectors 26 and 27 are eliminated and the drive signals output from the drive circuit 25 are supplied to the gate electrodes of the power semiconductor elements of the power modules PM1 and PM2 via the signal wire path of the drive circuit board 95. In addition, in this embodiment, the detection signals from the sensor circuits 28 and 30 are input to the drive circuit 25 via the signal wire path of the drive circuit board 95.

The drive circuit 25 is provided in the middle of the parallel mounting direction of the drive circuit board 29. As a result, in this embodiment, the length of the signal wire path from the drive circuit 25 to the gate electrode of the power semiconductor element of the power module PM1 and the length of the signal wire path from the drive circuit 25 to the gate electrode of the power semiconductor element of the power module PM2 are substantially the same. As a result, as is the case in the first embodiment, in this embodiment also, the current cross-section area of the ground wire path of the drive circuit board 95 can be made larger than the current cross-section area of the power source wire path and control of the power semiconductor element of the power module PM2 and control of power semiconductor element of the power module PM1 can be the same without reducing the inductance of the signal wire path.

In this embodiment, the length of the wire distance of the signal transmission path from the sensor circuit 30 to the drive circuit 25 and the length of the wire distance of the signal transmission path from the sensor circuit 28 to the drive circuit 25 are substantially the same. Thus, as is the case in the first embodiment, in this embodiment also, the transmission properties of the filter circuit at the sensor circuit 30 can be made greater than the transmission properties of the filter circuit at the sensor circuit 28, and the detection accuracy of the sensor circuit 28 and the detection accuracy of sensor circuit 30 can be the same without electrically tuning the determination values and the like.

Embodiment 4

The fourth embodiment of this invention will be described based on FIG. 11.

Figure 11:
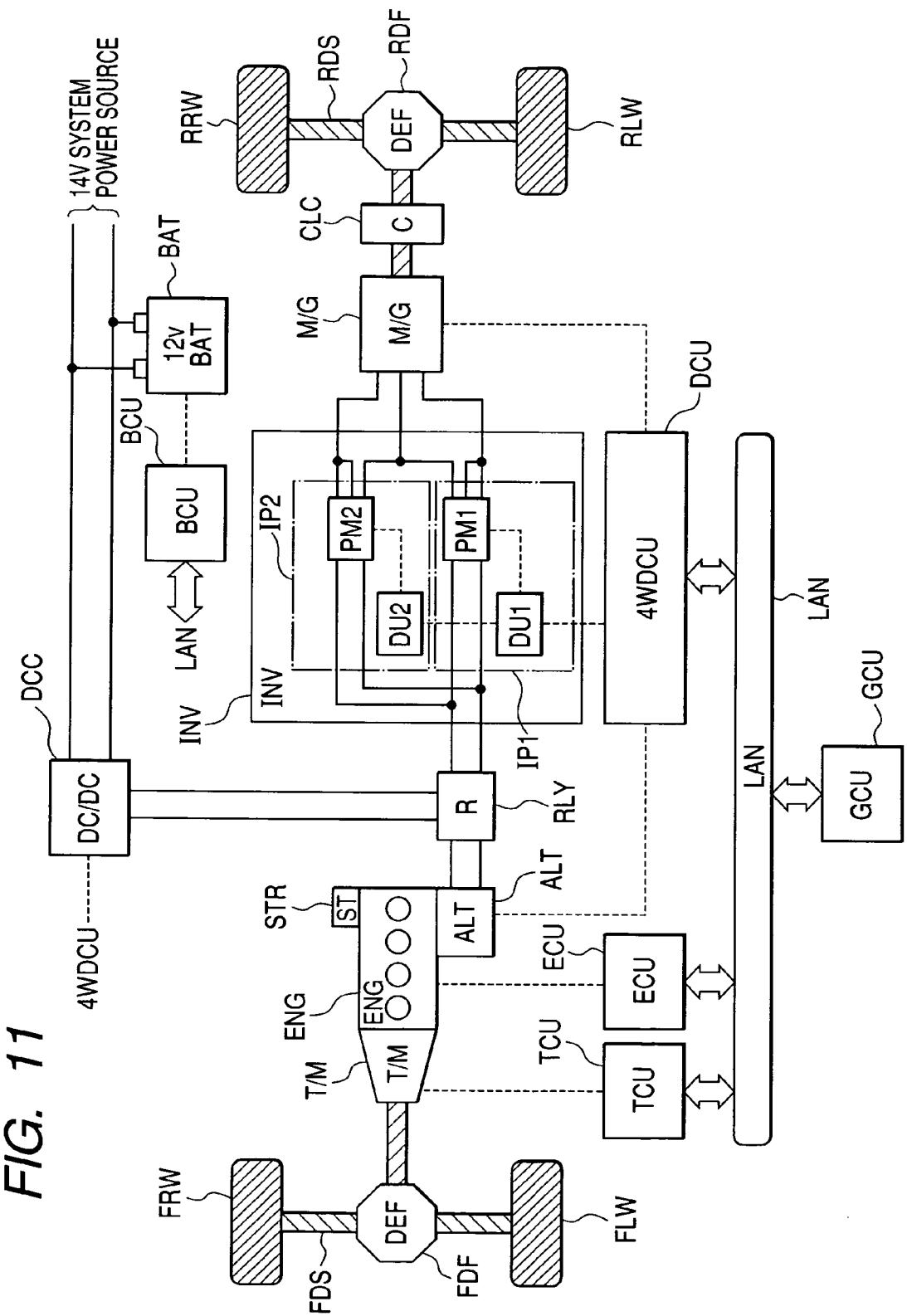
FIG. 11 shows the fourth embodiment, and is a block diagram showing the configuration of the drive system of the four-wheel drive motor vehicle in which the on-vehicle inverter unit of any of the first to third embodiments is applied.

FIG. 11 shows the structure of a vehicle which uses the vehicle inverter unit of any of the first to third embodiments. In the vehicle of this embodiment is a four-wheel drive motor vehicle in which either the front or rear wheels are driven by an internal combustion engine, while assisted driving of the other is done by motor force. It is to be noted that this embodiment describes the case in which front wheels are driven by an internal combustion engine, while assisted driving of the rear wheels is done by motor force.

The front drive shaft FDS of the front wheels FRW and FLW is mechanically connected to a deferential gear FDE. The deferential gear FDE operates in the same manner as the deferential gear described in the first embodiment. The deferential gear is mechanically connected to the transmission T/M. The transmission T/M transmits the rotational drive force that is output from the engine ENG and transmits it to the deferential gear FDF. The transmission T/M is mechanically connected to the engine ENG which is an internal combustion engine. The engine ENG comprises front wheels FRW and FLW drive sources.

It is to be noted that the engine ENG has a starter STR. The starter STR is for starting the engine.

The rear drive shaft RDS of the rear wheels RRW and RLW is mechanically connected to a deferential gear RDF. The deferential gear RDF is a deferential gear mechanism that distributes rotational drive force output from the motor generator M/G to both left and right sides of the rear drive shaft RDS. The clutch CLC is mechanically connected to the deferential gear RDF. The clutch CLC is attached when the assisted driving of the rear wheels RRW and RLW is required and cut off when assisted driving is not required. The motor generator M/G is mechanically connected to the clutch CLC. The motor generator M/G forms the assisted drive source for the rear wheels RRW and RLW.

It is to be noted that a synchronous machine including a Rundel type rotor described in the first embodiment may be used as the motor generator M/G.

The AC side of the inverter unit INV is electrically connected to the stator winding of the motor generator M/G. The inverter unit INV may be the one described in any of the first to third embodiments. It is to be noted that in the first to third embodiments, the motor control unit is incorporated into the inverter unit INV, but in this embodiment, the motor control unit is incorporated into the 4WD control unit DCU.

It is to be noted that this embodiment describes the case where the motor generator M/G and the inverter unit INV are formed as separate units, but the inverter unit INV may be integrally formed with the motor generator M/G at the end opposite to the clutch CLC end.

The output side of the vehicle generator ALT and the high voltage side of the DC/DC converter DCC are electrically connected via the relay RLY. The battery BAT is electrically connected to the low voltage side of the DC/DC converter DCC. The battery BAT has an output voltage of 12 v and comprises a 14 v system on-vehicle power source. The vehicle generator ALT is for a 42 v on-vehicle power source driven from the engine ENG and can variably output voltage of 1 v-50 v. The AC power generated by the on-vehicle generator ALT is rectified to DC power by a rectifier and output. The DC power output from the vehicle generator ALT is directly input to the DC side of the inverter unit INV or to the high voltage side of the DC/DC converter DCC.

In this embodiment, the connection between the three devices which are the vehicle generator ALT, the inverter unit INV and the DC/DC converter DCC may be switched based on the vehicle operation mode by the operation of the relay RLY.

It is to be noted that in this embodiment, a synchronous machine including a Rundel type rotor described in the first embodiment may be used as the vehicle generator ALT. The vehicle generator ALT allows variable output voltage from 1 v to 50 v by controlling the operation of the voltage regulator which controls the magnetic current supplied to the rotor magnetic winding.

The operation of the engine ENG is controlled by the engine control unit ECU as is the case in the first embodiment. The operation of the transmission T/M is controlled by the transmission control unit TCU as is the case in the first embodiment. The charging of the battery BAT is controlled by the battery control unit BCU as is the case in the first embodiment. The operation of the vehicle generator ALT, the relay RLY, the DC/DC converter DCC, the inverter unit INV, the motor generator M/G and the clutch CLC are each controlled by the 4W control unit 4WDCU. These control units are electrically connected to each other via an on-vehicle local area network (LAN) and are also electrically connected to the general control unit GCU.

The operation of the four-wheel drive motor vehicle of this embodiment will be described next. The four-wheel drive motor vehicle of this embodiment has a plurality of operation modes.

2 WD Running Mode;

The 2 WD running mode is the operation mode for driving the vehicle using the rotational drive force output from the engine ENG in accordance with the required torque τd, when the 4WD mode switch is off or on and the vehicle speed is greater than a prescribed value (for example 60 km/h).

The general control unit GCU outputs signal of a value equivalent to the engine rotation frequency corresponding to required torque τd to the engine control unit ECU in the case of the 2WD running mode. The operation control of the engine ENG is the same as that the first embodiment.

In addition, the general control unit GCU or the engine control unit ECU outputs generation command signals to the 4WD control unit DCU. The 4WD control unit DCU controls the relay RLY such that the vehicle generator ALT and the DC/DC converter DCC are electrically connected based on the generation command signals output from the general control unit GCU or the engine control unit ECU. The 4WD control unit DCU also outputs control signals to the voltage regulator of the vehicle generator ALT and to the drive circuit of DC/DC converter DCC such that necessary charge can be obtained based on the remaining charge in the battery BAT. The vehicle generator ALT controls the magnetic current supplied to the field magnet winding based on the control signals output from the 4WD control unit DCU and supplies the power needed for charging the battery BAT to the DC/DC converter DCC. The DC/DC converter DCC reduces the voltage of the power output from the vehicle generator ALT to a prescribed voltage and supplies it to the battery BAT and the 14 v system power source. The battery BAT is thereby charged.

4 WD Running Mode 1 (Start Assist);

The 4WD running mode 1 is the operation mode for driving the vehicle using the rotational drive force output from the engine ENG and the rotational force output from the motor generator M/G in accordance with the required torque τd when the 4WD mode switch is on and the vehicle speed exceeds 0 km/h and is less than a prescribed value (for example 60 km/h).

The general control unit GCU outputs torque control signals to the 4WD control unit DCU and the engine control unit ECU when the vehicle is in the 4WD running mode 1. The torque control signals output from the general control unit GCU are torque control signals corresponding to the required torque τde at the engine ENG and control signals corresponding to required torque τdm at the motor generator M/G side. The required torque τde and the required torque τdm are formed by dividing the required torque τd in accordance with the vehicle speed. The required torque τdm is less than the required torque τde. The required torque τdm and the required torque τde are highest when the vehicle moves off and subsequently they gradually decrease in accordance with vehicle speed. The required torque τdm is a prescribed value (such as 60 km/h) and becomes zero.

Torque command signals corresponding to the required torque τde are output to the engine control unit ECU. Subsequent operations at the engine side are the same as those of the 2WD running mode described above. Torque command signals corresponding to the required torque τdm are output to the 4WD control unit DCU. The 4WD control unit DCU calculates the control value for operating the power semiconductor elements of the power modules PM1 and PM2 of the inverter unit INV based on torque command signals output from the general control unit GCU. The control value obtained by this calculation is output to the drive circuit unit DU1 as the control signals. The drive circuit unit DU1 generates drive signals for operating the power semiconductor elements of the power modules PM1 and PM2 based on the control signals output from the 4WD control unit DCU and the drive signals are output to the power module PM1 and the drive circuit unit DU2. The drive circuit unit DU2 outputs drive signals output from the drive circuit unit DU1 to the power module PM2. In addition, the 4WD control unit DCU calculates the control value for operating the voltage regulator of the motor generator M/G based on torque command signals output from the general control unit GCU. The control value obtained by this calculation is output to the voltage regulator of the motor generator M/G as the control signals. Furthermore, the 4WD control unit DCU calculates the control value for operating the voltage regulator of the vehicle generator ALT based on torque command signals output from the general control unit GCU. The control value obtained by this calculation is output to the voltage regulator of the vehicle generator ALT as control signals.

The power semiconductor elements of the power modules PM1 and PM2 perform the switching operation (ON/OFF) based on the drive signals output from the drive circuit units DU1 and DU2. As a result, the power modules PM1 and PM2 convert the DC power supplied directly from the vehicle generator ALT to three-phase AC power, and this is output to the stator winding of the motor generator M/G. The voltage regulator of the motor generator M/G controls the magnetic current supplied to the field magnet winding based on the control signals output from the 4WD control unit DCU. As a result, the motor generator M/G generates rotational drive force in accordance with the vehicle speed using the three-phase AC power supplied stator winding from the power modules PM 1 and PM2 and the magnetic current supplied to the field magnet winding from the voltage regulator. The rotational drive force output from the motor generator M/G is transmitted to the rear drive shaft RDS via the clutch CLC and the deferential gear RDF, and this drives the rear wheels RRW and RLW.

The voltage regulator of the vehicle generator ALT controls the field magnet current supplied to the field magnet winding based on the control signals output from the 4WD control unit DCU. As a result, the vehicle generator ALT generates power required to drive the motor generator M/G using the field magnet current supplied to the field magnet winding and the rotational drive force to the engine ENG.

The 4WD control unit DCU controls the relay RLY in order for the vehicle generator ALT and the inverter unit INV to be electrically connected during the 4WD running mode and prior to starting 4WD or such that the electrical connection of the vehicle generator ALT and the inverter unit INV is released in the case where the vehicle speed exceeds a prescribed value (such as 60 km/h) and 4WD running is cancelled. Furthermore, the 4WD control unit DCU controls the clutch CLC in order for the vehicle deferential gear RDF and the motor generator M/G to be electrically connected during the 4WD running mode and prior to starting 4WD running or such that the electrical connection of the deferential gear RDF and the motor generator M/G is released, in the case where the vehicle speed exceeds a prescribed value (such as 60 km/h) and 4WD running is cancelled.

4 WD Running Mode 2 (Slip Assist);

The 4WD running mode 2 is the operating mode in which the motor generator M/G is operated in accordance with speed difference and in which the speed difference is controlled to zero in the case where the 4WD mode switch is on in 4WD running mode 1 or when there is a speed difference (slip) between the front wheel FRW and FLW and the rear wheels RRW and RLW during the 2WD running mode.

When the vehicle is in the 4WD running mode 2, the 4WD control unit DCU switches to control based on the speed difference the front and rear wheels caused by control by the required torque τd. As a result, detection signals output from the speed sensor provided at the front wheels FRW and FLW and the rear wheels RRW and RLW are output to the 4WD control unit DCU. The 4WD control unit DCU obtains the speed difference of the front and rear wheels based on the detection signals output from the speed sensor, and the required torque is obtained from this speed difference, and the control value for operating the power semiconductor elements of the power modules PM1 and PM2 of the inverter unit INV is calculated from the required torque. The control value obtained by this calculation is output to the drive circuit unit DU1 as the control signals. The 4WD control unit DCU calculates the control value for operating the voltage regulator of the motor generator M/G based on the required torque. The control value obtained by this calculation is output to the voltage regulator of the motor generator M/G as the control signals. In addition, the 4WD control unit DCU calculates the control value for operating the voltage regulator of the vehicle generator ALT based on the required torque. The control value obtained by this calculation is output to the voltage regulator of the vehicle generator ALT as the control signals. Subsequent operation is the same as in the 4WD running mode 1.

In the case where the difference in speed of the front and rear wheels converges to zero, a switch is made from the 4WD running mode 2 to the 4WD running mode 1 or the 2WD running mode Regeneration Mode;

The regeneration mode is the operation mode for generation in which the wheel movement (rotation) energy is transmitted to the motor generator M/G and the motor generator M/G is operated as a generator in the case where the 4WD mode switch is on, the vehicle speed is more than zero, the accelerator is not being pressed, and the charge amount of the battery BAT is less than the prescribed value.

In the case where the drive conditions of the regeneration mode are met, the general control unit GCU outputs torque command signals to the engine control unit ECU such that the engine brake operates. The general control unit GCU outputs torque command signals to the 4WD control unit DCU for generating prescribed rated power at the motor generator M/G. In this case, the torque command signals output from the general control unit GCU to the 4WD control unit DCU are negative signals in the opposite direction from the torque control signals for generating the rotational drive force. The 4WD control unit DCU calculates the control value for operating the voltage regulator of the motor generator M/G based on the required torque. The control value obtained by this calculation is output to the drive circuit unit DU1 as the control signals. In addition, the 4WD control unit DCU calculates the control value for operating the voltage regulator of the motor generator M/G based on the torque command signal output from the general control unit GCU. The control value obtained by this calculation is output to the voltage regulator of the motor generator M/G as the control signals. Subsequent operation is the same as in the 4WD running mode 1.

The power semiconductor elements of the power modules PM1 and PM2 perform the switching operation (ON/OFF) based on the drive signals output from the drive circuit units DU1 and DU2. As a result, the power modules PM1 and PM2 convert the three-phase AC power supplied from the motor generator M/G to DC power, and this is output to DC/DC converter DCC.

In addition, the 4WD control unit DCU controls the relay RLY such that the inverter unit INV and the DC/DC converter DCC are electrically connected during the regeneration mode, and the clutch CLC is controlled such that the motor generator M/G and the deferential gear RDF are mechanically connected.

Furthermore, the 4WD control unit DCU calculates the control value for operating the power semiconductor elements of the DC/DC converter DCC based on torque command signals output from the general control unit GCU in order to drop the power output from the inverter unit INV down to a prescribed voltage. The control value obtained by this calculation is supplied to the DC/DC converter DCC as control signals. The drive circuit of the DC/DC converter DCC generates drive signals for operating the power semiconductor elements of the DC/DC converter DCC based on the control signals output from the DC/DC converter DCC. The generated drive signals are supplied to power semiconductor elements from the drive circuit of the DC/DC converter DCC. The switching operation (On/Off) is performed based on the drive signals output from the drive circuit of the DC/DC converter DCC. As a result, the power output from the inverter INV is reduced to a prescribed voltage and supplied to the battery BAT and the 14 v system power source. The battery is charged with the power supplied from the DC/DC converter DCC.

This embodiment achieves the same effects as those of the first to third embodiments.

Embodiment 5

Figure 12:
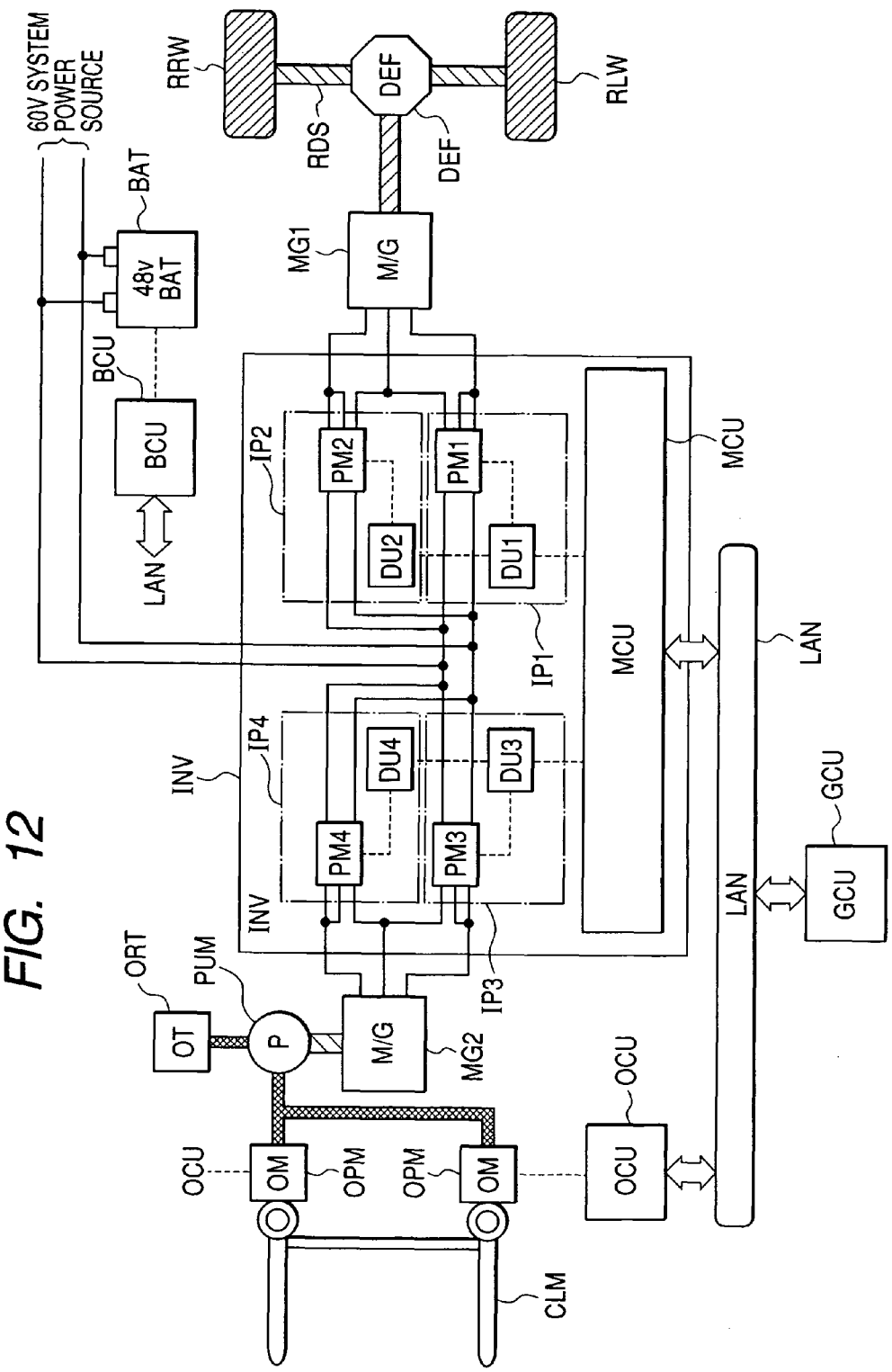
FIG. 12 shows the fifth embodiment, and is a block diagram showing the configuration of the drive system and loading system of the industrial vehicle in which the on-vehicle inverter unit of any of the first to third embodiments is applied.

The fifth embodiment of this invention is described based on FIG. 12.

FIG. 12 shows the structure of a vehicle which applies the vehicle inverter unit of any one of the first to third embodiments. In the vehicle of this embodiment, the vehicle is run by the rear wheels being driven motor force and is an industrial vehicle which performs stacking and loading of cargo by driving the loading device using motor power. In this embodiment, the industrial vehicle described is a battery type fork lift.

The rear drive shaft RDS of the rear wheels RRW and RLW is mechanically connected to a deferential gear RDF. The deferential gear DEF distributes rotational force output from the motor generator MG1 to both left and right sides of the rear drive shaft RDS. The deferential gear RDF is mechanically connected to the motor generator MG1. The motor generator MG1 comprises the rear wheels RRW and RLW.

It is to be noted that in this embodiment, a synchronous machine including a rotor having a permanent magnet for a field magnet is used as the motor generator MG1 as is the case in the first embodiment.

The first AC side of the inverter unit INV is electrically connected to the stator winding of the motor generator MG1. The DC side of the inverter unit INV is electrically connected to the battery BAT. The battery BAT has an output voltage of 48 v and comprises a 60 v on-vehicle power source.

The inverter unit INV has the intelligent power modules IP1-IP4 and the motor control unit MCU. The intelligent power modules IP1 and IP2 are those described in any of the first to third embodiments and they drive the motor generator MG1. Accordingly, the first AC side of the inverter unit INV is the AC side of the power modules PM1 and PM2.

The intelligent power modules IP3 and IP4 drive the motor generator MG2 which is the drive source of the hydraulic operating unit of the cargo loading machine CLM and they have the same configuration as the intelligent power modules IP1 and IP2. The stator winding of the motor generator MG2 is electrically connected to the second AC side (AC side of power modules PM3 and PM4) of the inverter unit INV.

The cargo loading machine CLM comprises a mast which is provided so as to be erect at the rear of the vehicle and pawls for moving the mast in the vertical direction. The hydraulic device is formed from a hydraulic operating mechanism for the pawl of the cargo loading machine CLM in the vertical direction; an oil tank ORT for storing oil; an oil pump PUM for pumping oil to the hydraulic operation mechanism OPM; and a motor generator MG2 for driving the oil pump PUM.

The operation of the inverter unit INV and the motor generators MG1 and MG2 is controlled the motor control unit MCU. The operation of the hydraulic operation mechanism OPM is controlled by the oil control unit OCU. The charging of the battery BA is controlled by the battery control unit BCU in the same manner as the first embodiment. These control units are electrically connected to each other via an on-vehicle local area network (LAN) and are also electrically connected to the general control unit GCU.

Next, the operation of the industrial vehicle of this embodiment will be described. The industrial vehicle of this embodiment has a plurality of operation modes.

Powering Mode

The powering mode is the operation mode which drives the vehicle using the rotational drive force output from the motor generator MG1 based on the required torque τdd.

When the driver presses the accelerator, the general control unit GCU determines the required torque τdd based on the amount of pressing of the accelerator. The required torque τdd which is obtained is output to the motor control unit MCU as torque command signals. The motor control unit MCU calculates the control value for operating the power semiconductor elements of the power modules PM1 and PM2 based on torque command signals output from the general control unit GCU. The control value obtained by this calculation is output to the drive circuit unit DU1 as the control signals. The drive circuit unit DU1 generates drive signals for operating the power semiconductor elements of the power modules PM1 and PM2 based on the control signals output from the motor control unit MCU and the drive signals are output to the power module PM1 and the drive circuit unit DU2. The drive circuit unit DU2 outputs drive signals output from the drive circuit unit DU1 to the power module PM2.

The power semiconductor elements of the power modules PM1 and PM2 perform the switching operation (ON/OFF) based on the drive signals output from the drive circuit units DU1 and DU2. As a result, the power modules PM1 and PM2 convert the DC power supplied from the battery BAT to three-phase AC power, and this is output to the stator winding of the motor generator MG1. As a result, the motor generator MG1 generates rotational drive force in accordance with the three-phase AC power supplied stator winding from the power modules PM 1 and PM2. The rotational drive force output from the motor generator MG1 is transmitted to the rear drive shaft RDS via the deferential gear DEF, and this drives the rear wheels RRW and RLW.

Loading Operation Mode

The loading operation mode is the operation mode for driving the hydraulic operation device using the rotational drive force output from the motor generator MG2 based on required torque τdu when the driver operates the loading lever and when the pawl of the cargo loading machine CLM is moved upwards.

When the driver operates the loading lever, the general control unit GCU determines the required torque τdu based on the operation of the loading lever. The required torque τdu which is obtained is output to the motor control unit MCU as torque command signals. The motor control unit MCU calculates the control value for operating the power semiconductor elements of the power modules PM3 and PM4 based on torque command signals output from the general control unit GCU. The control value obtained by this calculation is output to the drive circuit unit DU3 as control signals. The drive circuit unit DU3 generates drive signals for operating the power semiconductor elements of the power modules PM3 and PM4 based on the control signals output from the motor control unit MCU, and the drive signals are output to the power module PM3 and the drive circuit unit DU4. The drive circuit unit DU4 outputs drive signals output from the drive circuit unit DU3 to the power module PM4.

The power semiconductor elements of the power modules PM3 and PM4 perform the switching operation (ON/OFF) based on the drive signals output from the drive circuit units DU1 and DU2. As a result, the power modules PM1 and PM2 convert the DC power supplied from the battery BAT to three-phase AC power, and this is output to the stator winding of the motor generator MG2. As a result, the motor generator MG2 generates rotational drive force in accordance with the three-phase AC power supplied to the stator winding from the power modules PM3 and PM4. The rotational drive force output from the motor generator MG2 is transmitted to the pump PUM. As a result, the pump PUM is driven and oil is pumped from the oil tank ORT to the hydraulic operation mechanism OPM and the hydraulic operation mechanism OPM operates. As a result, the drive signals are transmitted to the rear drive shaft RDS via the deferential gear DEF, and the pawl of the cargo loading machine CLM moves upward.

Regeneration Mode 1;

The regeneration mode 1 is the operation mode for generation in which the wheel movement (rotation) energy is transmitted to the motor generator MG1 and the motor generator MG1 is operated as a generator in the case where the ignition key switch is on, the accelerator is not being pressed, the vehicle speed is greater than zero, and the charge amount of the battery BAT is less than a prescribed value.

In the case where the drive conditions of the regeneration mode 1 are met, the general control unit GCU outputs torque command signals to the motor control unit MCU such that prescribed rated power is generated at the motor generator MG1. The torque command signals output from the general control unit GCU to the motor control unit MCU are negative signals which are in the opposite direction from the torque control signals for generating the rotational drive force. The motor control unit MCU calculates the control value for operating the power semiconductor elements of the power modules PM1 and PM2 based on the torque command signals output from the general control unit GCU. The control value obtained by this calculation is output to the drive circuit unit DU1 as the control signals. Subsequent operation is the same as in the 4WD running mode 1.

The power semiconductor elements of the power modules PM1 and PM2 perform the switching operation (ON/OFF) based on the drive signals output from the drive circuit units DU1 and DU2. As a result, the power modules PM1 and PM2 convert the three-phase AC power supplied from the motor generator MG1 to DC power, and this is output to the battery BAT and the 60 v system on-vehicle power source. The battery BAT is charged with the supplied DC current.

Regeneration Mode 2;

The regeneration mode 2 is the operation mode for generation in which the oil pump PUM movement (rotation) energy is transmitted to the motor generator MG2, and the motor generator MG2 is operated as a generator in the case where the raised cargo loading machine CLM s lowered.

In the case where the drive conditions of the regeneration mode 2 are met, the general control unit GCU outputs torque command signals to the motor control unit MCU such that prescribed rated power is generated at the motor generator MG2. The torque command signals output from the general control unit GCU to the motor control unit MCU are negative signals which are in the opposite direction from the torque control signals for generating the rotational drive force. The motor control unit MCU calculates the control value for operating the power semiconductor elements of the power modules PM3 and PM4 based on the torque command signals output from the general control unit GCU. The control value obtained by this calculation is output to the drive circuit unit DU3 as the control signals. The drive circuit unit DU3 generates drive signals for operating the power semiconductor elements of the power modules PM3 and PM4 based on the control signals output from the motor control unit MCU, and the drive signals are output to the power module PM3 and the drive circuit unit DU4. The drive circuit unit DU4 outputs drive signals output from the drive circuit unit DU3 to the power module PM4.

The power semiconductor elements of the power modules PM3 and PM4 perform the switching operation (ON/OFF) based on the drive signals output from the drive circuit units DU3 and DU4. As a result, the power modules PM3 and PM4 convert the three-phase AC power output from the motor generator MG2 to DC power, and this is output to the battery BAT and the 60 v system on-vehicle power source. The battery BAT charged with the supplied DC current.

The same effects as those of the first to third embodiments are achieved in this embodiment.

What is claimed is:

1. A power converter which converts power output from a power supply source to a prescribed power and outputs the converted power to a power supply destination, the power converter comprising:
    a module section; and
    a drive section for operating the module section;
    the module section comprises a plurality of semiconductor modules;
    the plurality of semiconductor modules have semiconductor elements for power conversion;
    corresponding semiconductor elements are electrically connected in parallel to form a parallel circuit;
    the parallel circuit is electrically connected between the power supply source and the power supply destination;
    the drive section comprises a drive circuit, a first signal wire and a second signal wire;
    the drive circuit is provided so as to correspond to a first semiconductor element which is one of the semiconductor elements constituting the parallel circuit; wherein
    the drive circuit outputs drive signals for operating the first semiconductor element;
    so that the first semiconductor element operates by receiving the drive signals output from the drive circuit;
    the first signal wire connects to the drive circuit and transmits the drive signals to the first semiconductor element from the drive circuit;
    the second signal wire branches from the first signal wire and transmits the drive signals branched from the first signal wire to a second semiconductor element which is another, different semiconductor element constituting the parallel circuit; and
    the second semiconductor element receives the branched drive signals and operates in the same manner as the first semiconductor element.

2. The power converter of claim 1, wherein the plurality of semiconductor modules comprises:
    identical module cases;
    identical module bases which conduct heat; identical insulating substrates;
    identical input-side terminals; and
    identical output-side terminals;
    the semiconductor elements which are mounted on the module bases via the insulating substrates so as to have identical arrangement in the plurality of semiconductor modules are stored in the module cases; and
    the semiconductor elements and the input-side terminals, as well as the semiconductor elements and the output-side terminals are electrically connected by the same connection method such that the connection configuration is identical in the plurality of semiconductor modules.

3. The power converter of claim 1, wherein the drive section comprises:
a power source that applies operating voltage to the drive circuit; and
reference potential wires which electrically connect the reference potential side of power source, the reference potential side of the drive circuit, and the electrodes which will represent the reference potential side of the first and second semiconductor elements; and
of the reference potential wires, the reference potential wires which extend to a plurality of the modules are configured such that the current cross-section area of the portion that extends to the plurality of modules is larger than the current cross-section area for the other portions.

4. The power converter of claim 3, wherein of the reference potential wires, those reference potential wires which extend to a plurality of the modules are such that the number of the portions that extend to the plurality of modules are more than the number of the other portions.

5. The power converter of claim 3, wherein of the reference potential wires, those reference potential wires which extend to a plurality of the modules have a means for limiting the current amount.

6. The power converter of claim 1, wherein
the first signal wire extends from the drive circuit to the first semiconductor element side;
the second signal wire that branches from the first signal wire reaches to the second semiconductor element; and
the wire distance of the first signal wire and the second signal wire are substantially the same.

7. The power converter of claim 1, wherein the drive circuit comprises:
a first substrate that is loaded in a first semiconductor module which is one of the plurality of semiconductor modules; and
a second substrate that is loaded in a second semiconductor module which is another of the plurality of semiconductor modules which is separate from the first semiconductor module; and
the first substrate comprises:
the drive circuit;
a first input terminal for receiving control signals output from control devices; and
a first output terminal for outputting the drive signals to the second substrate side; and
the second substrate comprises a second input terminal for receiving the drive signals output from the first output terminal.

8. The power converter of claim 7, wherein the drive section comprises:
a power source that applies operating voltage to the drive circuit; and
reference potential wires which electrically connect the reference potential side of power source, the reference potential side of the drive circuit, and the electrodes which will represent the reference potential side of the first and second semiconductor elements; and
the first substrate has the power source and the reference potential wires; and
the second substrate has the reference potential wires that spans from the first substrate; and
of the reference potential wires, the reference potential wire which spans from the first substrate to the second substrate is configured such that the current cross-section area of the portion that spans to the first substrate, and second substrate is larger than the current cross-section area for the other portions.

9. The power converter of claim 1, wherein the drive section comprises one substrate that spans to and is loaded in the plurality of semiconductor modules; and
the substrate comprises:
the drive circuit;
an input terminal for receiving control signals output from control devices;
wherein the first signal wire extends from the drive circuit and reaches to the first semiconductor element side; and
the second signal wire that branches from the first signal wire reaches to the second semiconductor element; and
the wire distance of the first signal wire and the second signal wire are substantially the same.

10. A power converter which converts direct current output from a power supply source to alternating current and outputs the converted alternating current power to a power supply destination, the power converter comprising:
a module section; and
a drive section for operating the module section;
the module section comprises a plurality of semiconductor modules;
the plurality of semiconductor modules have a plurality of serial circuits, each serial circuit formed by electrically connecting a plurality of semiconductor elements for power conversion serially;
parallel circuits of corresponding phases, each parallel circuit comprising a plurality of the serial circuits that are electrically connected to each other in parallel;
the parallel circuits are electrically connected between the corresponding power supply source and the corresponding power supply destination;
the drive section comprises a drive circuit, a first signal wire and a second signal wire; and
the drive circuit is provided so as to correspond to a first serial circuit which is one of the serial circuits constituting the parallel circuits;
wherein the drive circuit outputs drive signals for operating the semiconductor element constituting the first serial circuit;
the semiconductor elements constituting the first serial circuit operate by receiving drive signals output from the drive circuit;
the first signal wire connects to the drive circuit and transmits the drive signals to a corresponding semiconductor element constituting the first serial circuit from the drive circuit;
the second signal wire branches from the first signal wire, and transmits the drive signals branched from the first signal wire to a corresponding semiconductor element constituting the second serial circuit which is another different serial circuit constituting the parallel circuits; and
the semiconductor element constituting the second serial circuit receives the branched drive signals and operates in the same manner as the semiconductor element constituting the first serial circuit.

11. The power converter of claim 10, wherein the plurality of semiconductor modules comprise:
identical module cases;
identical module bases which conduct heat; identical insulating substrates:
identical input-side terminals; and
identical output-side terminals; and
the semiconductor elements which are mounted on the module bases via the insulating substrates so as to have identical arrangement in the plurality of semiconductor element modules are stored in the module cases; and the semiconductor elements and the input-side terminals, as well as the semiconductor elements and the output-side terminals are electrically connected by the same connection method such that the connection configuration is identical in the plurality of semiconductor modules.

12. The power converter of claim 10, wherein the drive circuit section comprises:

a plurality of high potential side power sources that apply operating voltage to the drive circuit and are provided to correspond to the high potential side of the parallel circuit of each phase;

a low potential side power source that applies operating voltage to the drive circuit and is provided so as to be shared at the low potential side of the parallel circuit for each phase;

a plurality of high potential side reference potential wires which electrically connect the reference potential side of power source, the reference potential side of the drive circuit, and the electrodes which will represent the reference potential side of the plurality of semiconductor elements at the high potential side of the plurality of serial circuits comprising the parallel circuit;

a low potential side reference potential wire which electrically connects the reference potential side of the low potential power source, the reference potential side of the drive circuit, and the electrodes which will represent the reference potential side of the plurality of semiconductor elements at the low potential side of the plurality of serial circuits comprising the parallel circuit for each phase; and of the high potential reference potential wires and the low potential reference potential wires, the reference potential wires which span to a plurality of the modules are configured such that the current cross-section area of the portion that spans to the plurality of modules is larger than the current cross-section area for the other portions.

13. The power converter of claim 10, wherein:

the first signal wire extends from the drive circuit and reaches to the first semiconductor element side; and the second signal wire that branches from the first signal wire reaches to the second semiconductor element; and the wire distance of the first signal wire and the second signal wire are substantially the same.

* * * * *